(12) United States Patent
Betser et al.

(10) Patent No.: US 7,864,588 B2
(45) Date of Patent: Jan. 4, 2011

(54) MINIMIZING READ DISTURB IN AN ARRAY FLASH CELL

(75) Inventors: Yoram Betser, Mazkeret Batya (IL); Yair Sofer, Tel-Aviv (IL); Oren Shlomo, Nesher (IL); Avri Harush, Kyriat Bialik (IL)

(73) Assignee: Spansion Israel Ltd., Netanya (IL)

( * ) Notice: Subject to any disclaimer, the term of this patent is extended or adjusted under 35 U.S.C. 154(b) by 55 days.

(21) Appl. No.: 12/232,418

(22) Filed: Sep. 17, 2008

(65) Prior Publication Data

US 2009/0073760 A1    Mar. 19, 2009

Related U.S. Application Data

(60) Provisional application No. 60/972,840, filed on Sep. 17, 2007, provisional application No. 60/990,948, filed on Nov. 29, 2007.

(51) Int. Cl.
    *G11C 16/04*    (2006.01)
(52) U.S. Cl. .............................. 365/185.2; 365/185.21; 365/196; 365/207; 365/210.1; 365/189.09
(58) Field of Classification Search .............. 365/185.2, 365/185.21, 196, 207, 210.1, 189.09
    See application file for complete search history.

(56) References Cited

U.S. PATENT DOCUMENTS

| | | | |
|---|---|---|---|
| 5,650,959 A | 7/1997 | Hayashi et al. | |
| 5,768,192 A | 6/1998 | Eitan | |
| 5,963,465 A | 10/1999 | Eitan | |
| 5,966,603 A | 10/1999 | Eitan | |
| 6,011,725 A | 1/2000 | Eitan | |
| 6,030,871 A | 2/2000 | Eitan | |
| 6,130,452 A | 10/2000 | Lu et al. | |
| 6,133,095 A | 10/2000 | Eitan | |
| 6,175,519 B1 | 1/2001 | Lu et al. | |
| 6,215,148 B1 | 4/2001 | Eitan | |
| 6,233,180 B1 | 5/2001 | Eitan | |
| 6,285,574 B1 | 9/2001 | Eitan | |
| 6,292,394 B1 | 9/2001 | Cohen et al. | |
| 6,448,750 B1 | 10/2002 | Shor et al. | |
| 6,477,084 B1 | 11/2002 | Eitan | |
| 6,552,387 B1 | 4/2003 | Eitan | |
| 6,583,007 B1 | 6/2003 | Eitan | |

(Continued)

OTHER PUBLICATIONS

"Design Considerations in Scaled SONOS Nonvolatile Memory Devices"   http://klabs.org/richcontent/MemoryContent/nvmt_symp/nvmts_2000/presentations/bu_white_sonos_lehigh_univ.pdf.

(Continued)

*Primary Examiner*—Thong Q Le
(74) *Attorney, Agent, or Firm*—Eitan Mehulal Law Group

(57) ABSTRACT

A method of reducing read disturb in NVM cells by using a first drain voltage to read the array cells and using a second, lower drain voltage, to read the reference cells. Drain voltages on global bitlines (GBLs) for both the array and the reference cells may be substantially the same as one another to maintain main path capacitance matching, while drain voltages on local bitlines (LBLs) for the reference cells may be lower than the drain voltage on local bitlines (LBLs) for the array cells to reduce second bit effect. Reducing the drain voltage of the reference cell at its drain port may be performed using a clamping device or a voltage drop device.

17 Claims, 5 Drawing Sheets

U.S. PATENT DOCUMENTS

| | | | |
|---|---|---|---|
| 6,633,496 | B2 | 10/2003 | Maayan et al. |
| 6,649,972 | B2 | 11/2003 | Eitan |
| 6,665,221 | B2 | 12/2003 | Abedifard et al. |
| 6,768,165 | B1 | 7/2004 | Eitan |
| 6,954,393 | B2 | 10/2005 | Lusky et al. |
| 6,967,896 | B2 | 11/2005 | Eisen et al. |
| 6,992,932 | B2 | 1/2006 | Cohen |
| 7,042,778 | B2 | 5/2006 | Chevallier |
| 7,123,532 | B2 | 10/2006 | Lusky et al. |
| 2003/0202411 | A1 | 10/2003 | Yamada |
| 2004/0008543 | A1* | 1/2004 | Kato .................... 365/189.01 |
| 2006/0267076 | A1* | 11/2006 | Sudo ......................... 257/316 |

OTHER PUBLICATIONS

"SONOS Nonvolatile Semiconductor Memories for Space and Military Applications" found at: http://klabs.org/richcontent/MemoryContent/nvmt_symp/nvmts_2000/papers/adams_d.pdf.

"Philips Research—Technologies—Embedded Nonvolatile Memories" found at: http://www.research.philips.com/technologies/ics/nvmemories/index.html.

"Semiconductor Memory: Non-Volatile Memory (NVM)" found at: http://www.ece.nus.edu.sg/stfpage/elezhucx/myweb/NVM.pdf.

* cited by examiner

MINIMIZING READ DISTURB IN AN ARRAY FLASH CELL

CROSS-REFERENCE(S) TO RELATED APPLICATION(S)

This application claims priority from U.S. Provisional Patent Application No. 60/972,840 filed Sep. 17, 2007 and U.S. Provisional Patent Application No. 60/990,948 filed Nov. 29, 2007 which are both hereby incorporated by reference in their entirety.

TECHNICAL FIELD

The disclosure relates to techniques for operating semiconductor devices and, more particularly, to operating non-volatile memory (NVM), such as floating gate (FG) devices or charge-trapping devices such as nitride read only memory (NROM), or other microelectronic cells or structures.

BACKGROUND

The Field Effect Transistor

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals. One type of transistor is known as the field effect transistor (FET).

The terminals of a field effect transistor (FET) are commonly named source (S), gate (G) and drain (D). In the FET a small amount of voltage is applied to the gate (G) in order to control current flowing between the source (S) and the drain (D). In FETs the main current appears in a narrow conducting channel formed near (usually primarily under) the gate. This channel connects electrons from the source terminal to the drain terminal. The channel conductivity can be altered by varying the voltage applied to the gate terminal, enlarging or constricting the channel and thereby controlling the current flowing between the source and the drain.

FIG. 1 illustrates a FET 100 comprising a p-type substrate (or a p-well in the substrate), and two spaced-apart n-type diffusion areas—one of which will serve as the "source", the other of which will serve as the "drain" of the transistor. The space between the two diffusion areas is the "channel". A thin dielectric layer is disposed over the substrate in the neighborhood of the channel, and a "gate" structure is disposed over the dielectric layer atop the channel. (The dielectric under the gate is also commonly referred to as "gate oxide" or "gate dielectric".) Electrical connections (not shown) may be made to the source, the drain, and the gate. The substrate may be grounded, or it may be biased at a desired voltage depending on applications.

Generally, when there is no voltage on the gate, there is no electrical conduction (connection) between the source and the drain. As voltage (of the correct polarity) is applied to the gate, there is a "field effect" in the channel between the source and the drain, and current can flow between the source and the drain, and can be controlled by the voltage applied to the gate. In this manner, a small signal (gate voltage) can control a relatively large signal (current flow between the source and the drain).

FET 100 is exemplary of a MOSFET (metal oxide semiconductor FET) transistor. With the specified "n" and "p" types shown above, an "n-channel MOSFET" can be formed. With opposite polarities (swapping "p" for "n" in the diffusions, and "n" for "p" in the substrate or well), a p-channel FET can be formed. In CMOS (complementary metal oxide semiconductor), both n-channel and p-channel MOS transistors may be used, and are often paired with one another.

An integrated circuit (IC) device may comprise many millions of FETs on a single semiconductor "chip" (or "die"), measuring only a few centimeters on each side. Several IC chips may be formed simultaneously, on a single "wafer", using conventional semiconductor fabrication processes including deposition, doping, photolithography, and etching. After all the chips are formed, they can be singulated from the wafer.

The Floating Gate Transistor

A floating gate transistor is generally a transistor structure, broadly based on the FET, as described hereinabove. As illustrated in FIG. 2, floating gate transistor 200 has a source and a drain, but rather than having only one gate, it has two gates which are called control gate (CG) and floating gate (FG). It is this arrangement of control gate and floating gate which enables the floating gate transistor to function as a memory cell, as described hereinbelow.

The floating gate is disposed over tunnel oxide (comparable to the gate oxide of the FET). The floating gate is a conductor, the tunnel oxide is an insulator (dielectric material). Another layer of oxide (interpoly oxide, also a dielectric material) separates the floating gate from the control gate.

Since the floating gate is a conductor, and is surrounded by dielectric material, it can store a charge. Electrons can move around freely within the conductive material of the floating gate (which comports with the basic definition of a "conductor").

Since the floating gate can store a charge, it can exert a field effect on the channel region between the source and the drain, in a manner similar to how a normal FET works, as described hereinabove. Mechanisms for storing charges on the floating gate structure, as well as removing charges from the floating gate, are described hereinbelow.

Generally, if a charge is stored on the floating gate, this represents a binary "1". If no charge is stored on the floating gate, this represents a binary "0". (These designations are arbitrary, and can be reversed so that the charged state represents binary "0" and the discharged state represents binary "1".) That represents the programming "half" of how a floating gate memory cell operates. The other half is how to determine whether there is a charge stored on the floating gate—in other words, to "read" the memory cell. Generally, this is done by applying appropriate voltages to the source, drain and gate terminals, and determining how conductive the channel is. Some modes of operation for a floating gate memory cell are described hereinbelow.

Normally, the floating gate non-volatile memory (NVM) cell has only a single "charge-storing area"—namely, the conductive floating gate (FG) structure, and can therefore only store a single bit of information (binary "1" or binary "0"). More recently, using a technology referred to as "multi-level cell" (MLC), two or more bits can be stored in and read from the floating gate cell.

The NROM Memory Cell

Another type of memory cell, called a "nitride, read only memory" (NROM) cell, has a charge-storage structure which is different from that of the floating gate memory cell and which permits charges to be stored (or trapped) in two separate charge-storage areas. Generally, the two separate charge storage areas are located within a non-conductive layer disposed between the gate and the underlying substrate, such as a layer of nitride formed in an oxide-nitride-oxide (ONO) stack underneath the gate. The non-conductive layer acts as a charge-trapping medium. Generally, electrical charges will stay where they are put in the charge-trapping medium, rather than being free to move around as in the example of the conductive floating gate of the floating gate memory cell. A first bit of binary information (binary "1" or binary "0") can be stored in a first portion (such as the left-hand side) of the charge-trapping medium, and a second bit of binary information (binary "1" or binary "0") can be stored in a second portion (such as the right-hand side) of the charge-trapping medium. An alternative viewpoint is that different charge concentrations can be considered for each bit of storage. Using MLC technology, at least two bits can be stored in and read from each of the two portions (charge storage areas) of the charge-trapping medium (for a total of 4 bits), similarly 3 bits or more than 4 bits may be identified.

FIG. 3 illustrates a basic NROM memory cell 300, which may be viewed as an FET with an "ONO" structure inserted between the gate and the substrate. (One might say that the ONO structure is "substituted" for the gate oxide of the FET.)

The ONO structure is a stack (or "sandwich") of bottom (lower) oxide 322, a charge-trapping material such as nitride 324, and a top (upper) oxide 326. The ONO structure may have an overall thickness of approximately 10-25 nm, such as 18 nm, as follows:

the bottom oxide layer 322 may be from 3 to 6 nm, for example 4 nm thick;

the middle nitride layer 324 may be from 3 to 8 nm, for example 4 nm thick; and the top oxide layer 326 may be from 5 to 15 nm, for example 10 nm thick.

The NROM memory cell has two spaced apart diffusions 314 and 316 (which can function as source and drain, as discussed hereinbelow), and a channel region 320 defined in the substrate 312 between the two diffusion regions 314 and 316, and a gate 328 disposed above the ONO stack 321.

In FIG. 3, the diffusions are labeled "N+". This means that they are regions in the substrate that have been doped with an electron donor material, such as phosphorous or arsenic. These diffusions are typically created in a larger region which is a p-type cell well (CW) is doped with boron (or indium or both). This is the normal "polarity" for an NVM cell employing electron injection (but which may also employ hole injection, such as for erase). With opposite polarity (boron or indiun implants in an n-type cell well), the primary injection mechanism would be for holes, which is generally accepted to be not as effective as electron injection. One skilled in the art will recognize that the concepts disclosed herein can be applied to opposite polarity devices.

The charge-trapping material 324 is non-conductive, and therefore, although electrical charges can be stored in the charge-trapping material, they are not free to move around, and they will generally stay where they are stored. Nitride is a suitable charge-trapping material. Charge trapping materials other than nitride may also be suitable for use as the charge-trapping medium. One such material is silicon dioxide with buried polysilicon islands. A layer (324) of silicon dioxide with polysilicon islands would be sandwiched between the two layers of oxide (322) and (326). Alternatively, the charge-trapping layer 324 may be constructed by implanting an impurity, such as arsenic, into a layer of silicon dioxide deposited on top of the bottom oxide 322.

Memory cell 300 is generally capable of storing at least two bits of data—at least one bit(s) in a first storage area of the nitride layer 324 represented by the dashed circle 323, and at least one bit(s) in a second storage area of the nitride layer 324 represented by the dashed circle 325. Thus, the NROM memory cell can be considered to comprise two "half cells", each half cell capable of storing at least one bit(s). It should be understood that a half cell is not a physically separate structure from another half cell in the same memory cell. The term "half cell", as it may be used herein, is used herein only to refer to the "left" or "right" bit storage area of the ONO stack 321 (nitride layer 324). The storage areas 325, 323 may variously be referred to as "charge storage areas", "charge trapping areas", and the like, throughout this document. (The two charge storage areas may also be referred to as the right and left "bits".)

Each of the storage areas 325, 323 in the charge-trapping material 324 can exert a field effect on the channel region 320 between the source and the drain, in a manner similar to how a normal FET works, as described hereinabove (FIG. 2).

Generally, if a charge is stored in a given storage area of the charge-trapping material, this represents a binary "1", and if no charge is stored in a given storage area of the charge-trapping material, this represents a binary "0". (Again, these designations are arbitrary, and can be reversed so that the charged state represents binary "0" and the discharged state represents binary "1".) That represents the programming "half" of how an NROM memory cell operates. The other half is how to determine whether there is a charge stored in a given storage area of the charge-trapping material—in other words, to "read" the memory cell. Generally, this is done by applying appropriate voltages to the diffusion regions (functioning as source and drain) and gate terminals, and determining how conductive the channel is.

Modes of Operation

Generally, the modes of operation for any NVM memory cell (either floating gate or NROM) include "program", "erase" and "read". Modes of operation for NROM are now discussed.

Program generally involves injecting electrons into the charge storage areas of the NROM or other NVM cell, typically by a process known as channel hot electron (CHE) injection. Exemplary voltages to program (by CHE injection of electrons) the right bit (right bit storage area) of an NROM cell may include:

the left BL (acting as source, Vs) is set to 0 volts the right BL (acting as drain, Vd) is set to +5 volts the gate (Vg) is set to +8-10 volts the substrate (Vb) is set to 0 volts and the bit storage area above the drain (right BL) becomes programmed. To program the left bit storage area, source and drain are reversed—the left bitline serves as the drain, and the right bitline serves as the source.

Erase may involve injecting holes into the charge storage areas of the NROM cell, typically by a process known as hot hole injection (HHI). Generally, holes cancel out electrons (they are electrically opposite), on a one-to-one basis. Exemplary voltages to erase (by HHI injection of holes) the right bit of an NROM cell may include:

the left BL (acting as source, Vs) is set to float the right BL (acting as drain, Vd) is set to +5 volts the gate (Vg) is set to −7 volts the substrate (Vb) is set to 0 volts and the bit storage area above the drain (right BL) becomes erased. To erase the left bit storage area, source and drain are reversed—the left bitline serves as the drain, and the right bitline serves as the source.

Read may involve applying voltages to the terminals of the memory cell and, based on subsequent current flow, ascertaining the threshold voltage of the charge storage area within the cell. Generally, to read the right bit of the NROM cell, using "reverse read", the right BL (acting as source, Vs) is set to 0 volts
the left BL (acting as drain, Vd) is set to +2 volts
the gate (Vg) is set to +5 volts
the substrate (Vb) is set to 0 volts
and the bit storage area above the source (right BL) can be read. To read the left bit storage area, source and drain are reversed—the left bitline serves as the source, and the right bitline serves as the drain.

The following table summarizes the operating conditions discussed above, for an NROM cell, using representative (exemplary, approximate, illustrative, non-limiting) voltages.

|  | Program | Erase | Read |
| --- | --- | --- | --- |
| Drain Voltage | +5 | +5 | +2 |
| Source Voltage | 0 | float | 0 |
| Gate Voltage | +10 | −7 | +5 |
| Substrate | 0 | 0 | 0 |
| Comment(s) | the bit above the drain becomes programmed | the bit above the drain becomes erased | the bit above the source is read |

It is worth noting that during the read operation, the bias conditions are quite similar to those used during programming, except for lower voltage magnitudes, and this can result in the injection of electrons from the drain to the charge-trapping area above the drain (or, in the case of a floating gate cell, into the floating gate), thereby affecting the programming of the selected memory cell.

"Reading" an NROM Cell

Reading an NROM memory cell may involve applying voltages to the terminals of the memory cell comparable to those used to read a floating gate memory cell, but reading may be performed in a direction opposite to that of programming. Generally, rather than performing "symmetrical" programming and reading (as is the case with the floating gate memory cell, described hereinabove), the NROM memory cell is usually programmed and read "asymmetrically", meaning that programming and reading occur in opposite directions. This is illustrated by the arrows in FIG. 3. Programming is performed in what is termed the forward direction, and reading is performed in what is termed the opposite or reverse direction. For example, generally, to program the right storage area 323 (in other words, to program the right "bit"), electrons flow from left (source) to right (drain). To read the right storage area 323 (in other words, to read the right "bit"), voltages are applied to cause electrons to flow from right to left, in the opposite or reverse direction. For example, generally, to program the left storage area 325 (in other words, to program the left "bit"), electrons flow from right (source) to left (drain). To read the left storage area 325 (in other words, to read the left "bit"), voltages are applied to cause electrons to flow from left to right, in the opposite or reverse direction. See, for example, U.S. Pat. No. 6,768,165.

"Read" is generally done by measuring the Vt of a cell (or half-cell), and associating the measured Vt with a program level (such as "0" or "1"). Although the Vts of the cells are measured on an individual basis, it is generally necessary to determine a distribution of Vts for many cells in order to associate the measured Vt of a given cell with a program level, with confidence. For example—if only one cell were to be read, and its threshold voltage were to be found to be at or very near the RV between two program levels, it may be difficult to say, with certainty, at which of two program levels the single cell was programmed, since its threshold voltage may have moved slightly upward or slightly downward since it was programmed. This is a benefit of reading bits one block at a time—to obtain a statistically meaningful sample of Vts across a number of cells.

Memory Array Architecture, Generally

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

As discussed hereinabove, each memory cell comprises a first diffusion (functioning as source or drain), a second diffusion (functioning as drain or source) and a gate, each of which has a voltage applied thereto in order for the cell to be operated, as discussed hereinabove. (The substrate (or well) may also have a voltage applied thereto, such as 0 volts.)

Generally, the first diffusions (usually designated "source") of a plurality of memory cells are connected to a first bit line, which may be designated "BL(n)", and second diffusions (usually designated "drain") of the plurality of memory cells are connected to a second bit line which may be designated "BL(n+1)". Typically, the gates of a plurality of memory cells are connected to common word lines (WL).

The bitlines may be "buried bitline" diffusions in the substrate, and may serve as the source/drain diffusions for the memory cells. The wordlines may be polysilicon structures and may serve as the gate elements for the memory cells.

FIG. 4 illustrates an array of NROM memory cells (labeled "a" through "i") connected to a number of word lines (WL) and bit lines (BL). For example, the memory cell "e" has its gate connected to WL(n), its source (left hand diffusion) is connected to BL(n), and its drain (right hand diffusion) is connected to BL(n+1). The nine memory cells illustrated in FIG. 4 are exemplary of many millions of memory cells that may be resident on a single chip.

Notice, for example that the gates of the memory cells "e" and "f" (to the right of "e") are both connected to the same word line WL(n). (The gate of the memory cell "d" to the left of "e" is also connected to the same word line WL(n).) Notice also that the right hand terminal (diffusion) of memory cell "e" is connected to the same bit line BL(n+1) as the left-hand terminal (diffusion) of the neighboring memory cell "f". In this example, the memory cells "e" and "f" have two of their three terminals connected together.

The situation of neighboring memory cells sharing the same connection—the gates of neighboring memory cells being connected to the same word line, the source (for example, right hand diffusion) of one cell being connected to the drain (for example left hand diffusion) of the neighboring cell—is even more dramatically evident in what is called "virtual ground architecture" wherein two neighboring cells actually share the same diffusion. In virtual ground array architectures, the drain of one memory cell may actually be the same diffusion which is acting as the source for its neighboring cell. Examples of virtual ground array architecture may be found in U.S. Pat. Nos. 5,650,959; 6,130,452; and 6,175,519, incorporated in their entirety by reference herein.

The bitlines (BLs) mentioned above may extend in parallel with one another, through the array (or a portion thereof). A single buried bitline (BB) may be a single diffusion shared by two adjacent cell transistors, and may be referred to herein as a diffusion bitline (DBL). The diffusion bitline (DBL) is a diffusion, functioning as a conductive line, which is physically disposed ("buried") within the surface of the substrate.

A cell transistor may be formed by an ONO stack which is disposed on the surface of the substrate, generally between adjacent bitlines (BB, dbl). The ONO stack includes a layer of silicon nitride (nitride), which can trap (store) electrons and holes. A gate electrode, which may be doped (to be conductive) polysilicon, is disposed on the ONO stack, and may be a portion of an elongate wordline extending through the array (or a portion thereof).

An inter-level dielectric (ILD) may be disposed on the substrate to support patterns of metallization for interconnecting cell transistors. A portion of the pattern may comprise metal bitlines (MBLs). Contacts to the buried bitlines may be made by metal-filled plugs extending through the ILD to the buried bitlines, such as at intervals of every 16 cells. (It is generally not necessary to have one bitline contact per cell, and a contact area occupies area which otherwise could be used for cell transistors.)

In some of the memory array illustrations presented herein, the wordlines may extend horizontally through the array (or a portion thereof), and the bitlines may extend vertically through the array (or a portion thereof), intersecting the wordlines at right angles (90 degrees) thereto. Or, in some of the illustrations, the memory array may be rotated so that the wordlines extend vertically and the bitlines extend horizontally.

Generally, the cell transistors described herein may be "dual bit" transistors, such as NROM, having two bit storage (charge-trapping) areas, which may be referred to as the "left bit" and the "right bit".

Drain-Side and Source-Side Sensing

Generally, for an NROM cell having two bit storage areas, one over the drain (D) and another over the source (S), reading the bit over the source (S) may be performed by setting the drain "read" voltage (Vdr) to approximately +2 volts, such as 1.4 volts, and setting the source voltage (Vs) to approximately 0 volts (or ground). For example, with reference to FIG. 3, to read the "right" bit 323, use the left diffusion 314 as drain (D) and the right diffusion 316 as source (S). To read the "left" bit 325, use the right diffusion 316 as drain (D) and the left diffusion 314 as source (S).

With Vdr on the drain (D), the program level (as represented by Vt) stored over the source (S) may be sensed. Generally, to sense the Vt, current is measured, such as the current flowing into the drain (D) or the current coming out of the source (S). However, since these two currents are not identical, one may choose to perform either "drain-side" sensing (sensing the current going into the drain) or "source-side" sensing (sensing the current coming out of the source). Either the drain (D) or the source (S) may be used as the "sensing node".

Global Bitlines (GBLs) and Local Bitlines (LBLs)

The NVM memory cells discussed herein are "based on" FETs (compare FIGS. 1, 2 and 3), and comprise two spaced-apart diffusions which may function as source (S) and drain (D), and a gate (G), and a channel formed between the source (S) and the drain (D) based on a voltage stored or trapped in a medium (floating gate, or nitride layer) disposed above the channel. The gate (G) of a given memory cell may be a portion of a wordline (WL), and the two diffusions (S,D) of the memory cell may be a portion of two corresponding, neighboring bitlines, and may be referred to as diffusion bitlines (DBLs).

In order to gain access to the memory cells of a memory array, external circuitry (not shown) is provided to select given wordlines and bitlines, to read, program or erase the memory cells.

Generally, it is not practical to connect the external circuitry (such as select transistors) directly to the diffusion bitlines (DBLs), and various metal interconnect layers ("M#") are involved to effect the desired connections. In the case of the bitlines, this may involve local bitlines (LBLs) and global bitlines (GBLs).

Generally, the local bitline (LBL) is a metal line which is strapped to (connected in parallel with) the diffusion bitline (DBL) to improve the conduction, since DBL resistance tends to be relatively high. For example, local bitlines (LBLs) may be formed in a first metal layer ("M1"). Generally, the capacitances of both the DBL and LBL are summed to provide a total bitline capacitance. Higher up in the interconnect layers, such as at a third metal layer ("M3"), global bitlines (GBLs) are provided, which are connected to the external circuitry (such as select transistors) for applying voltages to the bitlines (such as may be required for program, erase and read operations). Global bitlines (GBLs) may be connected to Local bitlines (LBLs) by select transistors.

The mere presence of conductive lines and elements can introduce "stray", generally undesirable capacitances, referred to herein as "parasitic capacitances". A reason that these parasitic capacitances are generally undesirable, in the context of reading memory cells, is that they can "steal" current, by providing a "leakage" path. So, for example, when trying to read a memory cell programmed to a given voltage, the measured voltage may appear sufficiently lower to result in a false (erroneous) reading. When current leaks, voltage drops, generally according to the well known Ohm's law where E (voltage)=I (current) times R (resistance). More current leaking means more voltage dropping.

A "classic" capacitor generally comprises two conductive electrodes separated by a dielectric. All else being equal, in a capacitor, capacitance increases with the size of the conductive electrode(s).

Generally, stray ("parasitic") capacitances resulting from metal bitlines (MBLs) are much greater than those resulting from diffusion bitlines (DBLs), partially due to their size being bigger.

U.S. Pat. No. 7,042,778 (2006), incorporated by reference herein, discloses a flash array implementation with local and global bit lines. As noted therein, generally, semiconductor memories, including flash memory, are commonly built using multi-layering wiring having different "metal levels". A semiconductor memory having local and global bit lines may be manufactured so that local bit lines are located on a different metal level than global bit lines. Select transistors may be used to connect selected ones of the local bitlines to selected ones of the global bitlines.

U.S. Pat. No. 6,665,221 (2003), incorporated by reference herein, discloses that memory devices may include blocks of memory cells arranged in columns with each column of memory cells coupled to a local bit line. Such memory devices further include global bit lines having multiple local bit lines selectively coupled to each global bit line, with each global bit line extending to local bit lines in each memory block of a memory sector.

Multi-level Programming

In early NVM memory cells, there were generally only two program levels (or states), which represented binary "0" and binary "1", and this is referred to as "single level programming" (SLC). Generally, the program level is determined by the threshold voltage created by electrons (or holes) stored in the floating gate (of an FG cell) or in the charge-trapping medium (such as nitride layer, in NROM). For example, a binary "0" may have been represented by a threshold voltage (Vt) less than 4.0 volts, and a binary "1" may have been represented by a threshold voltage greater than 4.0 volts.

In modern NVM memory cells, four or more program levels are possible, representing, for example, binary "00"

(zero), binary "01" (one), binary "10" (two) and binary "11" (three). This (having more than two program levels) is referred to as "multi-level programming" (MLC), and exemplary threshold voltages representing these four program levels might be, for example:

the center value for "11" equals approximately 4.0 volts
the center value for "01" equals approximately 4.4 volts
the center value for "00" equals approximately 4.8 volts
the center value for "10" equals approximately 5.4 volts Thus, it is evident that multi-level programming is much more "sensitive" than single level programming and, when reading the contents of a memory cell, small changes or differences in measured voltage can lead to erroneous results.

On the Use of Reference Cells

Non-volatile memory (NVM) cells may have data bits stored therein that may be read, such as by means of a sense amplifier (SA). When reading a memory cell, a current flowing into the drain or out of the source may be measured, in order to determine the Vt of the charge storage area above the source (or, in the case of a floating gate memory cell, the Vt of the floating gate), and a voltage may be ascertained, which corresponds to a program level.

Many NVM arrays employ a "reference cell" as the basis for comparing the output of an "array cell" for a read operation. Both of these cells—the reference cell and the array cell—are memory cells, such as flash cells, and may be substantially identical with one another, although they may be located in different portions of the overall memory array (and, of course, on the same integrated circuit (IC) chip). The use of a reference cell may help compensate for changes in the overall array, such as due to voltage variations and temperature, and ensure a fairly stable reference for read operations.

Reference cells are memory cells that are programmed to one or more predetermined levels related to reading the contents (program level, data bits stored in) of the array cells. See, for example, U.S. Pat. No. 7,123,532 (Saifun, 2006) and U.S. Pat. No. 6,954,393 (Saifun, 2005).

Using reference cells to determine the program level of an array cell being read is somewhat analogous to "color matching". For example, when a dentist is trying to determine a patient's tooth color, for manufacturing a prosthetic (false tooth), he may hold a card with reference colors (generally, all slightly different shades of white) up against the patient's tooth, comparing the reference colors to the patient's tooth color, looking for the best match. When holding a color sample against the patient's tooth, the dentist may determine that the tooth is either lighter than or darker than the color sample.

In the context of reading using reference cells, usually a value for Vt obtained from an array cell being read is compared against a "known" value from a reference cell and, using the sense amplifier (SA), it is determined whether the value read from the array cell is greater than the value retrieved from the reference cell. It is generally very important that the paths leading from the sense amps to the array cells are "matched" with the paths to the reference cells, and that they are operated in the same manner (for example, using the same drain drivers and Vds to read reference cells as are used to read the array cells).

Read Disturb

As used herein, "flash cell" is synonymous with "memory cell", and includes "array cells", as distinguished from "reference cells". Generally, array cells are programmed with data or code based on usage (a user storing data or code, and data changing during usage), and reference cells are programmed only once, by the manufacturer.

As mentioned above, an NROM cell has two charge storage (trapping) areas, and is therefore sometimes referred to as having two "bits"—a left bit and a right bit. See, for example, FIG. 3.

When reading the right bit 323, a positive voltage (approximately 2 volts, for sake of this discussion) is put on the left diffusion 314, serving as drain (D). The right diffusion 316 serves as source (S), and is set to approximately 0 volts. During read, the drain-to-source potential difference (Vds) is thus approximately 2 volts. When the left bit 325 is being read, the drain and source functions of the diffusions are reversed—the right diffusion 316 is used as drain (D) and the left diffusion 314 is used as source (S).

As mentioned above, the read operation is similar to the program operation, but using lower voltages. (During the read operation, Vds is approximately 2 volts. During the program operation, Vds is approximately 5 volts.) Given the nature (and physics) of the programming mechanism, a read operation can be considered to be a "soft program".

The drain-to-source potential difference (Vds) which is used during read may be optimized for memory cell operation, and may be a value more like 1.4 volts than the exemplary 2 volts used herein.

Recall that during program, the bit above the drain is programmed, and the other bit above the source may be referred to as the "second bit". And, during read, the bit above the source is read, and the other bit above the drain may be referred to as the "second bit". Generally, if one bit is being operated upon (which may be referred to as the "bit of interest"), the other bit is referred to as the "second bit", and may exert an influence on the operation. For example, when reading the right bit, the program level of the left bit may exert an influence on the result of the read operation, and this may be referred to as the "second bit effect". So, any inadvertent (soft) programming of the second bit (left bit), such as when reading the bit of interest (right bit), can result in subsequent read errors when reading the bit of interest (right bit). For array bits, the disturb to the second bit itself is generally more important, because it is a bit by itself. The disturb through changing the second bit is a second order issue. The disturb on a reference cell is only through it's second bit because reference cells are typically used as 1 bit cells.

Read disturb is a phenomenon which may cause degradation of the logical state (Vt) of a flash memory cell (indifferent whether an array cell or a read cell) due to a read operation, and especially due to many (such as millions of) read operations. Generally, the larger the drain-to-source potential difference (Vds) and the larger the number of read operations, the greater the effect.

For reference cells, read disturb can be a very serious problem, since a given reference cell may need to be read many millions of times, many more times than a given array cell. In NVM designs, typically an NVM reference cell is used to define the logical state (program level) of the array cells. This reference cell may be used for reading a large amount of array cells.

For example, for an 8 Gbit (gigabit) 4 bit per cell NROM array with 256 sense amplifiers (SAs), each reference cell may serve 8388608 (8*1024*1024*1024/256/4) array NROM cells, each of which requires 2 read cycles. Thus, in this example, the read disturb of the reference cell is enhanced by approximately 1.5e7 (15 million) times compared to an array cell with similar characteristics.

In and of itself, the fact that reading one bit (such as the right bit) may partially program the other ("second") bit (such as the left bit) would seem to not present a problem, if the left bit were not ever going to be used, or read, or if these bits do not affect the state of the other "interesting" bits. However, when reading an NROM cell, the Vt of the other (second) bit will exert an influence on the measurement of Vt for the bit being read, and this is called the "second bit effect". When reading a two-bit cell, if the second bit is programmed or not, that will have an effect on the actual current that will be detected for the bit being read. When reading a cell which is completely "native" (not programmed), you may, for example, get a current such as 20 µA (microamps). However, when the second bit is programmed to the highest program level (highest Vt), the measured current may be much lower, for example, 15 µA instead of 20 µA.

The "second bit effect" (described in the previous paragraph) is different than "read disturb", although they are related in that read disturb does affect the second bit. Factors other than read disturb, beyond the scope of this discussion, can also affect the second bit effect. As mentioned above, for array cells, the read disturb affects a real bit. Only for reference cells, does the read disturb affect the second bit only.

Commonly-owned patents disclose structure and operation of NROM and related ONO memory cells. Some examples may be found in commonly-owned U.S. Pat. Nos. 5,768,192 and 6,011,725, 6,649,972 and 6,552,387.

Commonly-owned patents disclose architectural aspects of an NROM and related ONO array, (some of which have application to other types of NVM array), such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array, or the like. Some examples may be found in commonly-owned U.S. Pat. Nos. 6,233,180, and 6,448,750.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer.

Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM. Some examples may be found in commonly-owned U.S. Pat. Nos. 6,954,393 and 6,967,896.

Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon) and the like used for NVM devices. Further description of NVM and related technologies may be found at "Non Volatile Memory Technology", Vol. 1 & 2 (2005), Vol. 3 (2006) and Vol. 4 (2007), published by Saifun Semiconductor; "Microchip Fabrication", by Peter Van Zant, $5^{th}$ Edition 2004; "Application-Specific Integrated Circuits" by Michael John Sebastian Smith, 1997; "Semiconductor and Electronic Devices", by Adir Bar-Lev, $2^{nd}$ Edition, 1999; "Digital Integrated Circuits" by Jan M. Rabaey, Anantha Chandrakasan and Borivoje Nikolic, $2^{nd}$ Edition, 2002 and materials presented at and through http://siliconnexus.com, "Design Considerations in Scaled SONOS Nonvolatile Memory Devices" found at: http://klabs.org/richcontent/MemoryContent/nvmt_symp/nvmts_2000/presentations/bu_white_s onos_lehigh_univ.pdf, "SONOS Nonvolatile Semiconductor Memories for Space and Military Applications" found at: http://klabs.org/richcontent/MemoryContent/nvmt_symp/nvmts_2000/papers/adams_d.pdf, "Philips Research—Technologies—Embedded Nonvolatile Memories" found at: http://www.research.philips.com/technologies/ics/nvmemories/index.html, and "Semiconductor Memory: Non-Volatile Memory (NVM)" found at: http://www.ece.nus.edu.sg/stfpage/elezhucx/myweb/NVM.pdf, all of which are incorporated by reference herein in their entirety.

Glossary

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

When glossary terms (such as abbreviations) are used in the description, no distinction should be made between the use of capital (uppercase) and lowercase letters. For example "ABC", "abc" and "Abc", or any other combination of upper and lower case letters with these 3 letters in the same order, should be considered to have the same meaning as one another, unless indicated or explicitly stated to be otherwise. The same commonality generally applies to glossary terms (such as abbreviations) which include subscripts, which may appear with or without subscripts, such as "$X_{yz}$" and "Xyz". Additionally, plurals of glossary terms may or may not include an apostrophe before the final "s"—for example, ABCs or ABC's.

array memory cells may optionally be organized in an array of rows and columns, and may be connected to selected bit lines and word lines in the array. The array may be organized into various logical sections containing pluralities of memory cells, such as blocks, pages and sectors. Some of these sections may be physically isolated and operated independently from one another.

bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page". That is the "mathematical" definition of "bit". In some cases, the actual (physical) left and right charge storage areas of an NROM cell may be referred to as the left "bit" and the right "bit", even though they may store more than one binary bit (with MLC, each storage area can store at least two binary bits). The intended meaning of "bit" (mathematical or physical) should be apparent from the context in which it is used.

BL short for bit line. The bit line is a conductor connected to the drain (or source) of a memory cell transistor.

byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, for example, kilobyte (KB), megabyte (MB) and gigabyte (GB).

CHE short for channel hot electron. CHE is an "injection mechanism" for injecting electrons into a charge storage area of an NVM memory cell.

CHEI short for channel hot electron injection. sometimes abbreviated "CHE".

CMOS short for complementary metal oxide semiconductor. CMOS consists of n-channel and p-channel MOS transistors. Due to very low power consumption and dissipation, as well as minimization of the current in "off" state, CMOS is a very effective device configuration for implementation of digital functions. CMOS is a key device in state-of-the-art silicon microelectronics.

CMOS Inverter: A pair of two complementary transistors (a p-channel and an n-channel) with the source of the n-channel transistor connected to the drain of the p-channel transistor and the gates connected to each other. The output (drain of the p-channel transistor) is high whenever the input (gate) is low and the other way round. The CMOS inverter is the basic building block of CMOS digital circuits.

NMOS: n-channel CMOS.

PMOS: p-channel CMOS.

distribution overlap A number of cells programmed at a given program level may exhibit a distribution of threshold voltages. Usually, the distribution for one program level is separated from a distribution for another program level. However, due to threshold drift, one or both of the distributions may move towards the other, causing some of the threshold voltages to be the same. The region where the threshold voltages are the same for cells programmed at two different program levels is the distribution overlap.

disturb When applying a pulse to a specific bit by raising WL and/or BL voltages, neighboring bits located on the same WL and/or same BL might suffer from Vt shift that cause margin loss. The shift is called "disturb". Disturbs are a fault type where the content of a cell is unintentionally altered when operating on another cell. These faults have similar characteristics to coupling faults, however, they have special neighborhood requirements.

Disturb faults are generally caused by the presence of high/intermediate electric field stress on an insulating layer within the core memory cell. This electric field results in leakage current caused either by FN-tunneling, punchthrough, or channel hot electron injection. Whether a given mechanism is responsible for a particular disturb is a function of the operating conditions and the state of the investigated cell.

The IEEE Standard Definition and Characterization of Floating Gate Semiconductor Arrays disturb faults can be divided into the following:

Word-line erase disturb (WED): Exists when a cell under program (selected cell) causes another unprogrammed cell (unselected cell), sharing the same wordline, to be erased.

Word-line program disturb (WPD): Exists when a cell under program (selected cell) causes another unprogrammed cell (unselected cell), sharing the same wordline, to be programmed.

Bit-line erase disturb (BED): Exists when a cell under program (selected cell) causes another unprogrammed cell (unselected cell), sharing the same bit-line, to be erased.

Bit-line program disturb (BPD): Exists when a cell under program (selected cell) causes another unprogrammed cell (unselected cell), sharing the same bit-line, to be programmed.

Read disturb (RD): During read operation, the bias conditions are the same as programming conditions (except for lower voltage magnitudes) and can result in the injection of elections from the drain to the charge storage medium, thus programming the selected cell or half cell. This is known as soft program. In addition, unselected erased cells may become programmed, and those that are programmed may become erased, giving rise to what is known as gate read erase and channel read program, respectively. Both of these disturbs that occurs on un-addressed cells are considered to be another form of read disturbs.

EEPROM short for electrically erasable, programmable read only memory. EEPROMs have the advantage of being able to selectively erase any part of the chip without the need to erase the entire chip and without the need to remove the chip from the circuit. The minimum erase unit is 1 Byte and more typically a full Page. While an erase and rewrite of a location appears nearly instantaneous to the user, the write process is usually slightly slower than the read process; the chip can usually be read at full system speeds.

endurance Because they are written by forcing electrons through a layer of electrical insulation onto a floating gate (or charge-trapping medium), some NVM cells can withstand only a limited number of write and erase cycles before the insulation is permanently damaged, and the ability of the cell to function correctly is compromised. In modern Flash EEPROM, the endurance may exceed 1,000,000 write/erase cycles.

EPROM short for erasable, programmable read only memory. EPROM is a memory cell in which information (data) can be erased and replaced with new information (data).

erase a method to erase data on a large set of bits in the array, such as by applying a voltage scheme that inject holes or remove electrons in the bit set. This method causes all bits to reach a low Vt level. See program and read.

FC short for flash (memory) cell.

FET short for field effect transistor. The FET is a transistor that relies on an electric field to control the shape and hence the conductivity of a "channel" in a semiconductor material. FETs are sometimes used as voltage-controlled resistors. The terminals of FETs are called gate (G), drain (D) and source (S).

FG short for floating gate. The floating-gate transistor is a kind of transistor that is commonly used for non-volatile storage such as flash, EPROM and EEPROM memory. Floating-gate transistors are almost always floating-gate MOSFETs. Floating-gate MOSFETs are useful because of their ability to store an electrical charge for extended periods of time even without a connection to a power supply.

Flash memory Flash memory is a form of non-volatile memory (EEPROM) that can be electrically erased and reprogrammed. Flash memory architecture allows multiple memory locations to be erased or written in one programming operation. Two common types of flash memory are NOR and NAND flash. NOR and NAND flash get their names from the structure of the interconnections between memory cells. In NOR flash, cells are connected in parallel to the bit lines, allowing cells to be read and programmed individually. The parallel connection of cells resembles the parallel connection of transistors in a CMOS NOR gate. In NAND flash, cells are connected in series, resembling a NAND gate, and preventing cells from being read and programmed individually: the cells connected in series must be read in series. Some systems will use a combination of NOR and NAND memories, where a smaller NOR memory is used as software ROM and a larger NAND memory is partitioned with a file system for use as a random access storage area. NAND is best suited to flash devices requiring high capacity data storage. This type of flash architecture combines higher storage space with faster erase, write, and read capabilities over the execute in place advantage of the NOR architecture. See NAND, NOR.

FN tunneling Field emission—also called Fowler-Nordheim tunneling—is the process whereby electrons tunnel through a barrier in the presence of a high electric field. This quantum mechanical tunneling process is an important mechanism for thin barriers, such as those in metal-semiconductor junctions on highly-doped semiconductors. Using FN tunneling, electrons can be moved to the floating gate of a MOSFET memory cell.

half cell "half cell" (or "half-cell") is a term which is sometimes used to refer to the two distinct charge storage areas (left and right bits) of an NROM memory cell.

HHI short for hot hole injection. HHI is an "injection mechanism" for injecting holes into a charge storage area of an NVM memory cell. See CHE.

ILD short for inter-level (or inter-layer) dielectric. Generally, ILD is a relatively thick layer of oxide deposited on completed underlying structures (such as FETs), which will support a layer(s) of metal lines interconnecting the various underlying structures. Holes may be etched through the ILD and filled with metal to make contact with elements (such as source, drain, gate) of the underlying structures.

inhibit if it is desired to apply erase to a subset of bits, avoiding erase from other bits sharing the same bit lines (BLs), an inhibit signal may be applied on the others, for example, as a positive voltage on the gate, to avoid hole injection. This procedure is called inhibit.

MLC short for multi-level cell. In the context of a floating gate (FG) memory cell, MLC means that at least two bits of information can be stored in the memory cell. In the context of an NROM memory cell, MLC means that at least four bits of information can be stored in the memory cell—at least two bits in each of the two charge storage areas.

MOS short for metal oxide semiconductor.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

moving read reference as used herein, "moving read reference" refers to a technique, such as disclosed in U.S. Pat. No. 6,992,932, wherein reference voltages are determined to be used in reading cells programmed to a given program state. Generally, if an error is detected, such as by using error detection (ED) bits, the reference voltages may have to be adjusted until the error is resolved.

NAND NAND flash architecture memories are accessed much like block devices such as hard disks or memory cards. The pages are typically 512 or 2,048 or 4,096 bytes in size. Associated with each page are usually a few bytes (typically 12-16 bytes) that are used for storage of an error detection (ED) and correction checksum. The pages are typically arranged in blocks, such as 32 pages of 512 bytes, 64 pages of 2,048 bytes, or 64 pages of 4,096 bytes. With NAND architecture, programming may be performed on a page basis, but erasure can only be performed on a block basis.

Most NAND devices are shipped from the factory with some bad blocks, which are typically identified and marked according to a specified bad block marking strategy. The first physical block (block 0) is always guaranteed to be readable and free from errors. Hence, all vital pointers for partitioning and bad block management for the device are located inside this block (typically a pointer to the bad block tables). If the device is used for booting a system, this block may contain the master boot record.

nitride commonly used to refer to silicon nitride (chemical formula Si3N4). A dielectric material commonly used in integrated circuit manufacturing. Forms an excellent mask (barrier) against oxidation of silicon (Si). Nitride is commonly used as a hard mask or, in the case of an NVM memory cell having an ONO layer, as a charge-trapping material.

n-type semiconductor in which concentration of electrons is higher than the concentration of "holes". See p-type.

NOR Reading from NOR flash is similar to reading from random-access memory, provided the address and data bus are mapped correctly. Because of this, most microprocessors can use NOR flash memory as execute in place (XIP) memory, meaning that programs stored in NOR flash can be executed directly without the need to copy them into RAM. NOR flash chips lack intrinsic bad block management, so when a flash block is worn out, the software or device driver controlling the device must handle this, or the device will cease to work reliably.

NROM short for nitride(d) read only memory. Generally, a FET-type device having a charge trapping medium such as a nitride layer for storing charges (electrons and holes) in two discrete areas, near the source and drain diffusions, respectively.

NVM short for non-volatile memory. NVM is computer memory that can retain the stored information even when not powered. Examples of non-volatile memory include read-only memory, flash memory, most types of magnetic computer storage devices (for example, hard disks, floppy disk drives, and magnetic tape), optical disc drives, and early computer storage methods, such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of an NVM memory cell is a simple light switch. Indeed, such a switch can be set to one of two (binary) positions, and "memorize" that position.) NVM includes floating gate (FG) devices and NROM devices, as well a devices using optical, magnetic and phase change properties of materials.

ONO short for oxide-nitride-oxide. ONO is used as a charge storage insulator consisting of a sandwich of thermally insulating oxide, and charge-trapping nitride.

over-erase a condition that happens to some bits in a large bit set that are erased together, due to erase speed difference, due to the situation that some bits erase faster than other bits. Fast bits are particularly susceptible to over-erase. See erase.

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films may be obtained by thermal oxidation of silicon. Thermal SiO2 forms a smooth, low-defect interface with Si, and can be also readily deposited by CVD.

poly short for polycrystalline silicon (Si). Heavily doped poly Si is commonly used as a gate contact in silicon MOS and CMOS devices.

p-type semiconductor in which concentration of "holes" is higher than the concentration of electrons. See n-type. Examples of p-type silicon include silicon doped (enhanced) with boron (B), Indium (In) and the like.

PAE short for program after erase. PAE is useful to avoid cells that experienced over-erase and significant Vt reduction, to become leaky and cause read errors to all cells sharing the same bitlines.

page Generally, a grouping of memory cells can be termed a word, a grouping of words can be termed a page, and a grouping of pages can be termed a sector. Data may be accessed for reading and programming (or writing) by word or by page, while an entire sector is commonly accessed for erasing.

PBE short for program before erase. PBE is useful to bring cells to a more-or-less uniform level prior to performing an erase operation. Particularly, if a cell has been erased a number of times, it may otherwise end up with a negative Vt, which is generally undesirable.

PFROM short program flashROM. an inner design block (of Saifun) that stores instructions that the inner embedded microcontroller performs on flash devices.

program a method to program a bit in an array, by applying a voltage scheme that injects electrons. This method causes an increase in the Vt of the bit that is being programmed. Alternatively, with "high Vt erase", programming may be a lowering of the Vt of the memory cell. See erase and read. Program may sometimes, erroneously be referred to as "write". See write.

program rate as used herein, "program rate" refers to the number of times that a memory cell (or half cell) is programmed to various program (or threshold voltage) levels, such as representing a binary "1" or "0".

program time refers to the duration of a single program pulse, or the duration of the whole program sequence algorithm to program a bit set.

programmed "programmed" generally means that the threshold voltage (Vt) of a cell is above a predetermined "program verify" level (Vth).

PROM short for programmable read-only memory.

RAM short for random access memory. RAM refers to data storage formats and equipment that allow the stored data to be accessed in any order—that is, at random, not just in sequence. In contrast, other types of memory devices (such as magnetic tapes, disks, and drums) can access data on the storage medium only in a predetermined order due to constraints in their mechanical design.

read a method to read the digital data stored in the array. The read operation is usually performed in "blocks" of several cells. See erase and program.

refresh a part of the program or erase algorithms that checks the status of bits and applies pulses to bits that may have lost some of their Vt due to reliability margin loss.

retention Retention generally refers to the ability of a memory cell to retain charges inserted into the charge storage medium, such as a floating gate. The data retention of EPROM, EEPROM, and Flash may be limited by charge leaking from the floating gates of the memory cell transistors. Leakage is exacerbated at high temperatures or in high-radiation environments.

ROM short for read-only memory.

SA short for sense amplifier (or "sense amp"). A sense amplifier is generally used in conjunction with memory arrays to amplify a voltage coming off of a bit line. There are many versions of sense amplifiers used in memory chips.

sector a part of the array, usually larger than a page, which usually contains a few pages. A minimum erase might include a sector. For example:
  Erase Sector (ES): Group of cells that are erased by single erase command
  Physical Sector (PS): Group of ES connected by single grid of Word Lines (WL) and Bit Lines (BL), sharing same set of drivers.

SEI short for secondary electron injection (or simply "secondary injection"). SEI occurs as a result of impact ionization by CHE electrons (e1) near the drain diffusion, generating an electron-hole pair (e2-h2), the hole (h2) of which continues into the substrate whereat another impact ionization results in another electron-hole pair (e3-h3), and the e3 electron becomes injected into the charge storage area(s) of the memory cell.

Si Silicon, a semiconductor.

SI units The International System of Units (abbreviated SI from the French Le Système international d'unités) is the modern form of the metric system and is generally a system devised around the convenience of the number 10. It is the world's most widely used system of units, both in everyday commerce and in science. The SI system of units consists of a set of units together with a set of prefixes. There are seven "base units", which are meter (abbreviated "m", for length), kilogram (abbreviated "kg", for mass), second (abbreviated "s", for time), Ampere (abbreviated "A", for electric current), Kelvin (abbreviated "K", for thermodynamic temperature), mole (abbreviated "mol", for the amount of a substance), and candela (abbreviated "cd", for luminous intensity). A prefix may be added to the units to produce a multiple of the original unit. All multiples are integer powers of ten. For example, "kilo" denotes a multiple of a thousand and "milli" denotes a multiple of one-thousandth. Hence there are one thousand millimeters to the meter and one thousand meters to the kilometer.

SLC short for single level cell. In the context of a floating gate (FG) memory cell, SLC means that one bit of information can be stored in the memory cell. In the context of an NROM memory cell, SLC means that at least two bits of information can be stored in the memory cell.

slice a portion of a memory array, such as a group of bitlines, that are connected to one sense amplifier (sense amp, "SA").

SONOS Si-Oxide-Nitride-Oxide-Si, another way to describe ONO with the Si underneath and the Poly gate on top.

SRAM short for static random access memory. SRAM is a type of semiconductor memory. The word "static" indicates that the memory retains its contents as long as power remains applied, unlike dynamic RAM (DRAM) that needs to be periodically refreshed (nevertheless, SRAM should not be confused with read-only memory and flash memory, since it is volatile memory and preserves data only while power is continuously applied). SRAM should not be confused with SDRAM, which stands for synchronous DRAM and is entirely different from SRAM, or with pseudostatic RAM (PSRAM), which is DRAM configured to function, to an extent, as SRAM.

substrate typically a wafer, of monocrystalline silicon. A substrate is often covered by an oxide layer (sometimes referred to as a "pad oxide layer"). Pad oxide is usually relatively thin, that is, in the range of about 50 to about 500 Angstroms (5-50 nm), and can be formed, for example, by thermal oxidation of the substrate. Pad oxide may also be prepared by other methods. For example, silicon dioxide or reactive precursors like silane could be deposited by chemical vapor deposition (CVD). A nitride layer (sometimes referred to as a "pad nitride layer") may be formed to protect the pad oxide and the underlying substrate during various processing steps. It usually has a thickness in the range of about 100 Angstroms to about 6000 Angstroms (10-600 nm), such as in the range of about 1500 Angstroms to about 3000 Angstroms (150-300 nm). Conventional means can be used to apply the pad nitride, such as chemical vapor deposition (CVD).

TEHH short for Tunnel Enhanced Hot Hole injection. TEHH is an "injection mechanism".

Units of Length Various units of length may be used herein, as follows:

| meter (m) | A meter is the SI unit of length, slightly longer than a yard. 1 meter = ~ 39 inches. 1 kilometer (km) = 1000 meters = ~ 0.6 miles. 1,000,000 microns = 1 meter. 1,000 millimeters (mm) = 1 meter. 100 centimeters (cm) = 1 meter. |
|---|---|
| micron (μm) | one millionth of a meter (0.000001 meter); also referred to as a micrometer. |
| mil | 1/1000 or 0.001 of an inch; 1 mil = 25.4 microns. |
| nanometer (nm) | one billionth of a meter (0.000000001 meter). |
| Angstrom (Å) | one tenth of a billionth of a meter. 10 Å = 1 nm. | verify a read operation after applying a program or erase pulse, that checks if the applied program or erase pulse moved the Vt to the target level (program-verify or erase-verify level).

virtual ground array a topological architecture of memory cells where there is an electrical connection between neighboring cells.

V short for voltage. Different voltages may be applied to different parts of a transistor or memory cell to control its operation, such as:

| Vb | short for bulk (or substrate) voltage |
|---|---|
| Vd | short for drain voltage |
| Vg | short for gate voltage |
| Vs | short for source voltage |
| Vt | short for threshold voltage | wafer In microelectronics, a wafer is a thin slice of semiconducting material, such as a silicon crystal, upon which microcircuits are constructed. There are multiple orientation planes in the silicon crystal that can be used. The planes are defined by the "Miller Indices" methodology. Common orientations classified by the "Miller indices" are (100), (011), (110), and (111).

wear leveling Wear levelling (also written wear leveling) refers to a technique for prolonging the service life of some kinds of erasable computer storage media, such as flash memory. EEPROM and flash memory media have individually erasable segments, each of which can be put through a finite number of erase cycles before becoming unreliable. This can be anywhere between 10,000 and 1,000,000 cycles, for example, for NAND flash devices. Wear-levelling attempts to work around these limitations by arranging data so that erasures and re-writes are distributed evenly across the medium. In this way, no single sector prematurely fails due to a high concentration of write cycles.

word line or wordline, (WL). A conductor normally connected to the gate of a memory cell transistor. The wordline may serve as the gate electrode of several memory cells.

write a combined method usually involving first erasing a large set of bits, then programming new data into the bit set; the erase step is not required but it is customary. See erase and program.

BRIEF DESCRIPTION (SUMMARY)

According to some embodiments of the present invention, there is provided a method of sensing nonvolatile memory ("NVM") cells, wherein the method includes applying a first drain or source voltage to an NVM data bearing cell and applying a second drain or source voltage, different than the first drain/source voltage, to an NVM reference cell used to sense the NVM data bearing cell. The second drain/source voltage may be lower than the first drain/source voltage. The drain/source voltages on global bitlines (GBLs) for both the data bearing and the reference cell may be substantially the same, and the drain/source voltages on local bitlines (LBLs) for the data bearing and the reference cells may be different than one another. The drain/source voltage on the local bitlines (LBLs) for the reference cell may be lower than the drain/source voltage on the local bitlines (LBLs) for the data bearing cell.

According to further embodiments of the present invention, there may be provided a first drain or source driving circuitry to provide the first drain/source voltage and a second drain or source driving circuitry to provide the second drain/source voltage. A sensing path capacitance for the data bearing cell and a sensing path capacitance for the reference cell may be substantially matched.

According to further embodiments of the present invention, the drain/source voltage of the reference cell may be reduced at a drain or source port of the reference cell. The reduction may be achieved using a clamping device. Reduction may also be achieved using a resistor or a transistor connected as a resistor. The application of a different drain/source voltage to the reference cell may also be achieved by using a different trim option with the drain/source driver of the reference cell than that used for the driver of the data bearing cell.

According to further embodiments of the present invention, there may be provided a memory device comprising one or more data bearing cells, one or more reference cells adapted to be used for sensing/reading data bearing cells, and one or more circuit portions adapted to apply a different drain voltage to a reference cell being used to sense a data bearing cell than the drain voltage being applied to the cell being sensed. According to some embodiments of the present invention, the one or more circuit portions may be adapted to reduce a voltage between a voltage source and a drain of the reference cell. The one or more circuit portions may be adapted to reduce a voltage between a global bitline and local bitline associated with the drain/source of the reference cell. The one or more circuit portions may be a clamping device, a resistor or a transistor connected as a resistor. The one or more circuit portions may be a field effect transistor ("FET") transistor having its drain (D) connected to a given second global bitline, its source (S) connected to a given local bitline, and its gate (G) connected to a regulated voltage.

A technique is disclosed herein for read disturb minimization, particularly when reading reference cells. This may be achieved by applying a lower drain voltage to the reference cells than to the array cells. The technique may significantly reduce read disturb on the reference cells, while keeping the array and reference cell paths as matched as possible for accurate sensing.

"Read disturb" is a name for a phenomena in which, during a read operation, the memory cell (such as Flash cell) state is affected until it can change logical state. Read disturb is associated with drain voltage—generally, the larger the drain voltage, the more disturb on the flash cell. When using sensing techniques with matched reference flash cells, the read disturb is even worse for them compared to the array, because the amount of reads these reference cells go through is orders of magnitude larger than the array cells.

As disclosed herein, a separate lower drain voltage may be used for the reference cell compared to a higher drain voltage for the array cells. Lowering the array cells as well would adversely affect the reliability of the product, thus the drain voltage for the array cells is kept higher.

This disclosure provides a way to operate reference cells with a different drain voltage than array cells, during a read operation, which has low impact on the sensing scheme and especially on the matching between the reference and array path.

Generally, the disclosure involves applying a different drain voltage for the reference cell and the array cell. This may be done by applying the same drain voltage to the global bitlines (GBLs) serving the array cells and the reference cells, but on the reference path, adding additional mechanism (circuitry) which reduces the drain voltage on the reference flash cell port itself. This keeps the matching of the circuitry providing the drain voltage (in terms of noise, coupling, power supply rejection ratio, and more), and also keeps the matching of the significant path capacitance, which is the global bit lines. And, the only mismatch introduced is at the flash cell port (drain side), where the capacitance is relatively low and thus the resulting mismatch is small.

Advantages of the techniques disclosed herein may include:
(a) optimization of drain voltage of array cells and reference cells is decoupled from each others.
(b) Same circuitry for the drain driver, keeping the matching of this (sometime complicated) circuit intact.
Matching of sensing path is only slightly affected.

According to an embodiment of the disclosure, a method of reducing read disturb in NVM cells, a first portion of which are array cells and a second portion of which are reference cells, may comprise: using a first drain voltage to read at least selected ones of the array cells; and using a second drain voltage, different than the first drain voltage, to read at least selected ones of the reference cells. The second drain voltage may be lower than the first drain voltage.

Drain voltages on global bitlines (GBLs) for both the array and the reference cells may be maintained substantially the same as one another, while drain voltages on local bitlines (LBLs) for the reference cells may be lower than the drain voltage on local bitlines (LBLs) for the array cells.

The drain voltage on LBLs for the reference cells may be lower than the drain voltage on the GBLs for the reference cells. This may be implemented by circuitry for reducing the drain voltage of the reference cell at its drain port. The circuitry may comprise a clamping device. The circuitry may comprise a voltage drop device such as a resistor or a transistor connected as a resistor for providing a voltage drop.

A main path capacitance may be substantially matched between the array cells and the reference cell in terms of voltage level and all other parameters.

The NVM cells may be flash cells, and may be NROM cells.

According to an embodiment of the disclosure, a memory array comprising non-volatile memory (NVM) cells may comprise:
a first portion of the memory array comprises array cells for storing data bits;
a second portion of the memory array comprises reference cells used for reading the data bits stored in the array cells;
a plurality of first global bitlines (GBLs) associated with the array cells;
a plurality of first local bitlines (LBLs) associated with the array cells;
a plurality of second global bitlines (GBLs) associated with the reference cells;
a plurality of second local bitlines (LBLs) associated with the reference cells; and
circuitry, disposed between selected ones of the second global bitlines and selected ones of the second local bitlines, for reducing the drain voltage of the reference cell at its drain port.

The circuitry for reducing the drain voltage of the reference cells' drain ports may comprise a clamping device or a device such as a resistor or a transistor connected as a resistor for providing a voltage drop.

The techniques disclosed herein may be applicable to most NVM devices including, but not limited to, charge-trapping devices such as NROM (sometimes referred to as Nitride Read Only Memory), SONOS (Semiconductor Oxide Nitride Oxide Semiconductor; Silicon-Oxide-Nitride-Oxide-Silicon), SANOS (Silicon-Aluminum Oxide-Nitride-Oxide-Silicon), MANOS (Metal-Aluminum Oxide-Nitride-Oxide-Silicon), and TANOS (Tantalum-Aluminum Oxide-Nitride-Oxide-Silicon), and also to Floating Gate (FG) devices.

BRIEF DESCRIPTION OF THE DRAWING(S)

Reference will be made in detail to embodiments of the disclosure, examples of which may be illustrated in the accompanying drawing figures (FIGs). The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199a, 199b, 199c, etc. Such relationships, if any, between similar elements in the same or different figures, will become apparent throughout the specification, including, if applicable, in the claims and abstract.

Throughout the descriptions set forth in this disclosure, lowercase numbers or letters may be used, instead of subscripts. For example Vg could be written $V_g$. Generally, lowercase is preferred to maintain uniform font size.) Regarding the use of subscripts (in the drawings, as well as throughout the text of this document), sometimes a character (letter or numeral) is written as a subscript—smaller, and lower than the character (typically a letter) preceding it, such as "$V_s$" (source voltage) or "$H_2O$" (water). For consistency of font size, such acronyms may be written in regular font, without subscripting, using uppercase and lowercase—for example "Vs" and "H2O".

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. Usually, lines in a schematic diagram which cross over one another and where there is a dot at the intersection of the two lines are connected with one another, else (if there is no dot at the intersection) they are typically not connected with one another.

DETAILED DESCRIPTION

In the following description, various aspects of techniques for reducing read disturb will be described. For the purpose of explanation, specific configurations and details are set forth in order to provide a thorough understanding of the techniques. However, it will also be apparent to one skilled in the art that the techniques may be practiced without specific details being presented herein. Furthermore, well-known features may be omitted or simplified in order not to obscure the description (s) of the techniques.

Although various features of the disclosure may be described in the context of a single embodiment, the features may also be provided separately or in any suitable combination. Conversely, although the disclosure may be described herein in the context of separate embodiments for clarity, the disclosure may also be implemented in a single embodiment. Furthermore, it should be understood that the disclosure can be carried out or practiced in various ways, and that the disclosure can be implemented in embodiments other than the exemplary ones described herein below. The descriptions, examples, methods and materials presented in the in this specification, as well as in the claims, should not be construed as limiting, but rather as illustrative.

Since read disturb increases with drain-to-source voltage (Vds), an approach to reducing read disturb may to reduce the Vds on the array cells, as well as on the reference cells. The logic behind the reduction of both of these Vds voltages (on both the array cells and the reference cells) is to keep an as good as possible matching between the reference cell and the array cell. However, the array cell reliability/performance may be optimized to a specific range of Vds voltages, which may be larger than the Vds which would be necessary to keep the read disturb of the reference cell to the desired amount.

It is therefore disclosed herein to separate the Vds of the array cells from the Vds of the reference cells, and to optimize each of the voltages according to the different needs of the array cells and reference cells. As discussed in greater detail hereinbelow, this may be accomplished substantially without adversely affecting the desired matching of the reference cells and the array cells.

A Conventional Read Operation

Figure 1:
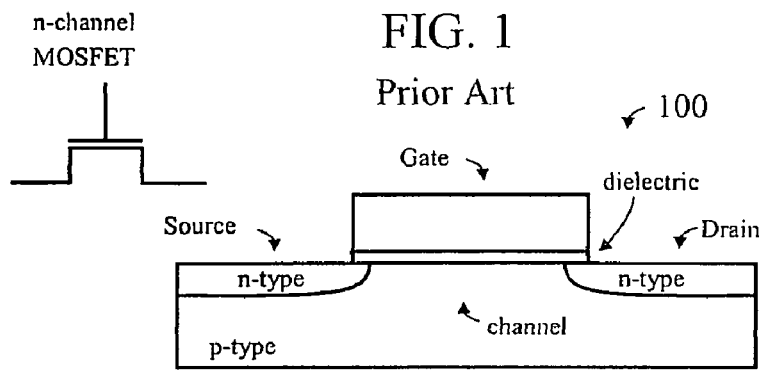
FIG. 1 is a stylized cross-sectional view of a field effect transistor (FET), according to the prior art. To the left of the figure is a schematic symbol for the FET.
Figure 2:
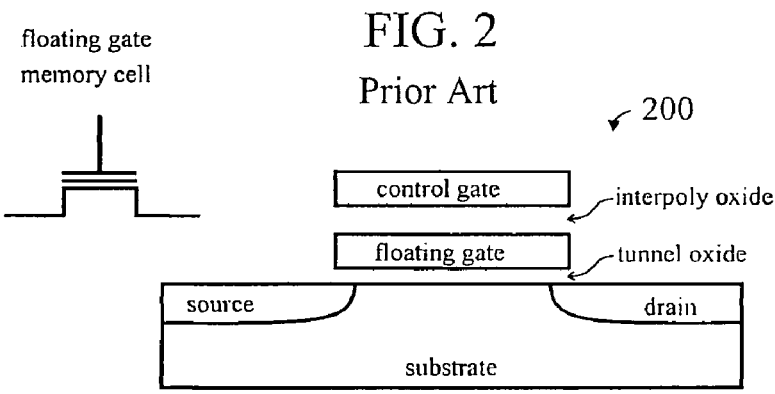
FIG. 2 is a stylized cross-sectional view of a floating gate memory cell, according to the prior art. To the left of the figure is a schematic symbol for the floating gate memory cell.
Figure 3:
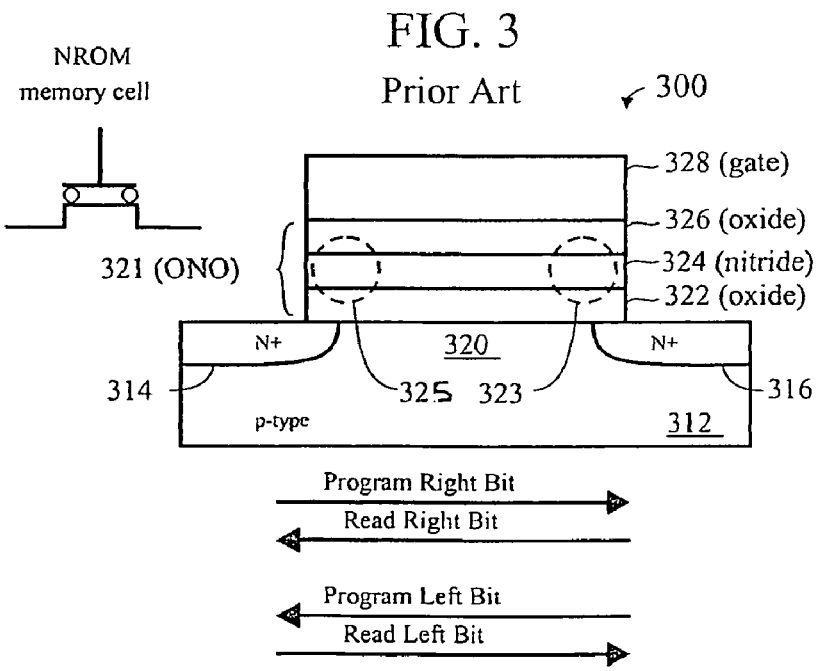
FIG. 3 is a stylized cross-sectional view of a two bit NROM memory cell of the prior art. To the left of the figure is a schematic symbol for the NROM memory cell.
Figure 4:
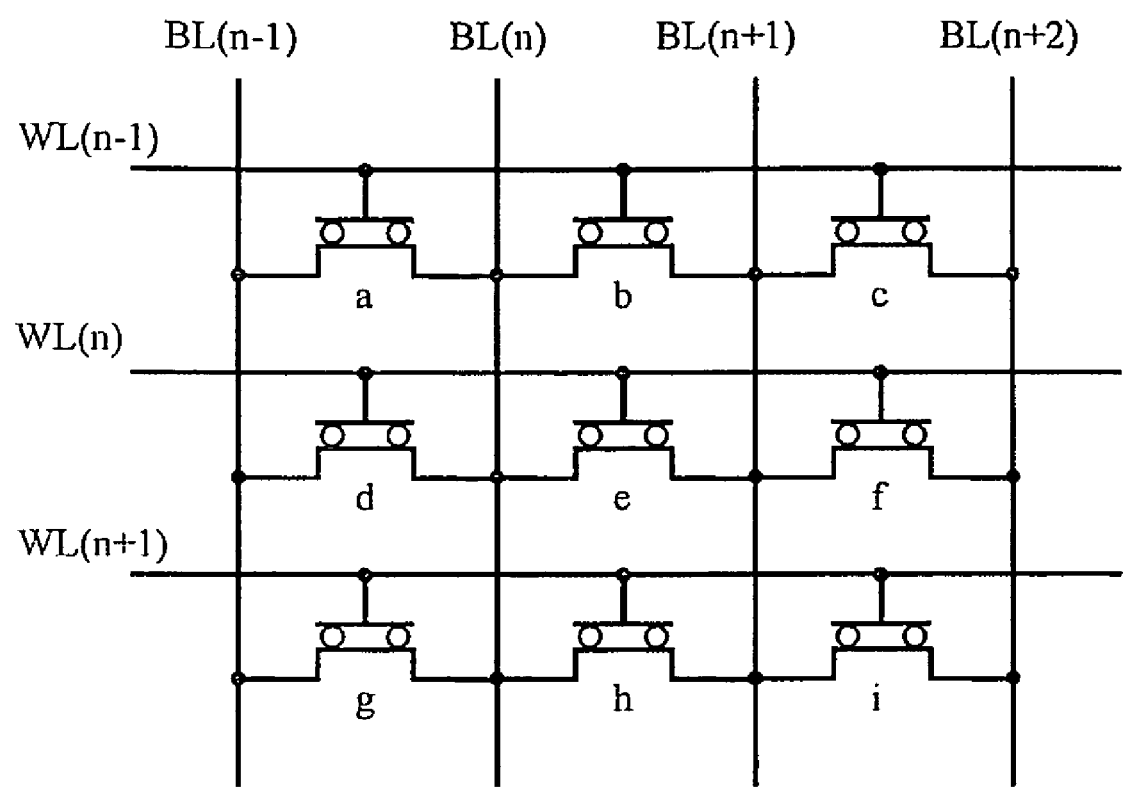
FIG. 4 is a diagram of a memory cell array with NROM memory cells, according to the prior art.
Figure 5:
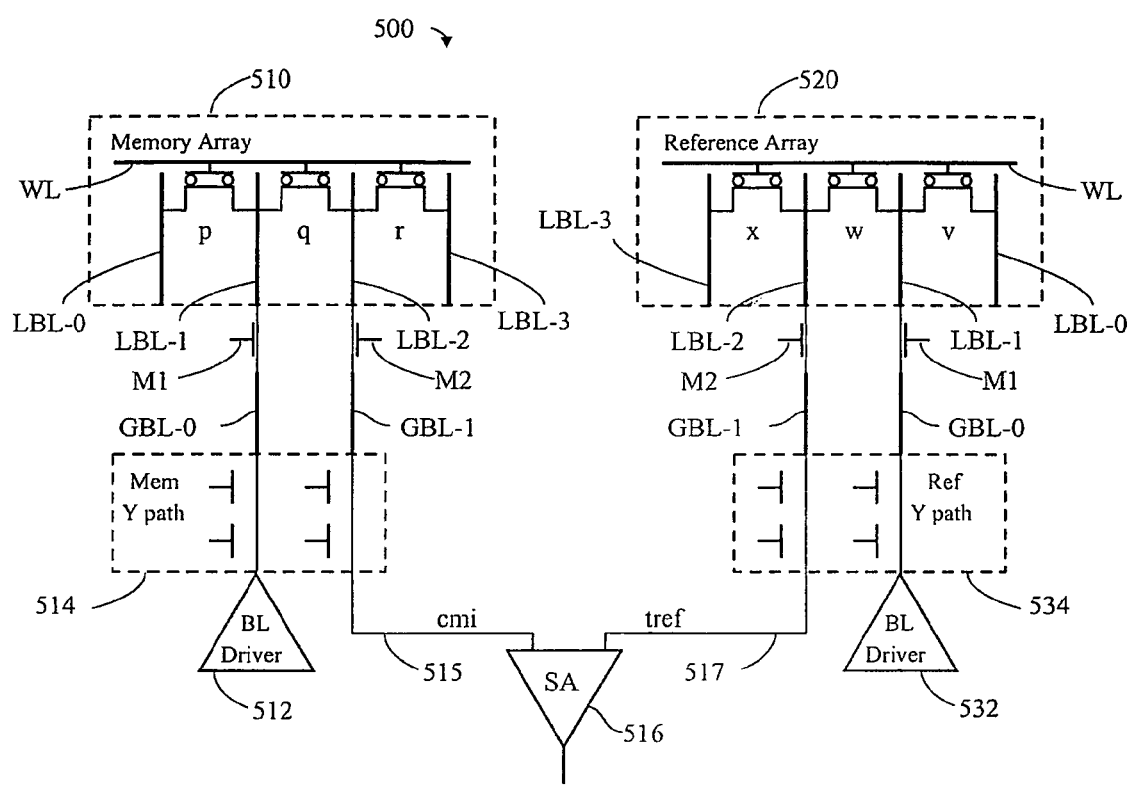
FIG. 5 is a diagram illustrating a read operation, according to the prior art.

FIG. 5 is a diagram 500 illustrating a read operation, according to the prior art. The operation will take place in an overall array of NVM memory cells, such as flash cells. (It should be understood that only a small portion of the overall array, which may have many millions of memory cells, is being illustrated.) The memory cells are divided into two parts (portions), a memory sector 510 and a reference sector 520. Each of these sectors is an "array" in its own right, and may be referred to as such (that is, "memory array" and "reference array"). However, reference array 520 may contain substantially fewer memory cells than memory array 510. In general, the reference array can also be constructed as a subset of the memory array block.

Memory array 510 comprises a plurality of wordlines, but only one of the wordlines, labeled "WL" is shown, for illustrative clarity. Memory array 510 comprises a plurality of array cells, but only three of array cells "p", "q" and "r" are shown, for illustrative clarity. Memory array 510 comprises a plurality of local bitlines (LBLs), but only three of these LBLs, labeled LBL-0, LBL-1, LBL-2 and LBL-3 are shown, for illustrative clarity. The three array cells "p", "q" and "r" are arranged and interconnected, as shown. The reading of one of the array cells "q" in particular will be discussed, and is exemplary of reading other array cells in memory array 510. The local bitlines (LBLs) may be diffusion bitlines (DBLs).

The illustrative memory cell "q" may be an NROM cell, having two bit storage areas, and is connected between LBL-1 and LBL-2. In order to read the right bit of memory cell "q", the drain (LBL-1) is driven to approximately +2 volts (Vdr), and the source (LBL-2) is set to approximately 0 volts (ground).

A bitline driver 512 (or "drain driver") provides the read voltage (Vdr) via a multiplexer (Y-mux, set of decoded switches) 514 to selected ones of a plurality of global bitlines (GBLs), which may be metal bitlines (MBLs), but only two of these GBLs, labeled GBL-0 and GBL-1 are shown, for illustrative clarity. In this example, drain driver 512 is shown providing the read voltage (Vdr), via the Y-mux 514, on GBL-0.

Generally, there are more local bitlines (LBLs) than global bitlines (GBLs), because several (such as six) LBLs may be associated with each GBL and selectively connected to the GBL. For example, in this illustration, a select transistor M1 is shown for connecting LBL-1 to GBL-0, and a select transistor M2 is shown for connecting LBL-2 to GBL-1. The select transistors M1 and M2 function essentially as "switches", simply making a connection between one line and another line. In this example, the select transistor M1 is shown connecting GBL-0 to LBL-1, as a result of which, the read voltage (Vdr) provided by drain driver 512, via Y-mux 514, is provided to LBL-1, which is connected to the drain (D) of array cell "q". (The "drain" of a memory cell may also be referred to as the "drain port" of the memory cell.)

For reading the stored program level (Vt) of the right bit in the cell "q", the drain (D), which is connected to LBL-1 is connected by M1 to GBL-0 and is driven to Vdr, and the source (S), which is connected to (or constituted by) LBL-2 is connected by M2 to GBL-1 and is grounded (substantially 0 volts).

Source-side sensing or drain-side sensing can be used to read the right bit. In this example, source-side sensing is illustrated, but the teachings of this disclosure are not limited thereto. Drain-side sensing (drain sensing) may be used.

Current flowing from the source (S), via LBL-2, M2, GBL-1 and Y-mux 514 is provided on a line 515 (a regular interconnect line) to one input of a differential sense amplifier (SA) 516 generating a voltage (cmi). This voltage (cmi), indicative of the program level on the right bit of the cell "q", will be compared (in 516) against one or more program levels which are stored in reference cells in the reference array, in order to determine the right bit of cell q's program level.

Generally, whatever voltage levels and parameters which are used to read the array cells should also be used to read the reference cells, to maintain path matching.

Reference array 520 is arranged substantially identically to memory array 510, and is illustrated in FIG. 5 as a "mirror image" thereof. Three reference cells "v", "w" and "x" are shown. Local bitlines LBL-0 and LBL-1 are selectively connected via select transistors (M1 and M2 to global bitlines GBL-0 and GBL-1. As illustrated, a current indicative of a program level in the left bit of cell "w" is being read, generating a voltage (tref) using source-side sensing, and provided on a line 517 to the other input of the sense amplifier (SA) 516. In this example of reading array cell "w", LBL-2 is used as source (S), and local bitline LBL-1 is used as drain (D).

In this example of a conventional read operation, the local bitlines LBL-1 and LBL-2 in reference array 520 are connected via select transistors M1 and M2 in reference array 520 to the global bitlines GBL-1 and GBL-2 associated with reference array 520, respectively, the select transistors M1 and M2 functioning essentially as simple "switches".

A bitline driver 532 (or "drain driver") provides the read voltage (Vdr) via a multiplexer (Y-mux, set of decoded switches) 534 to selected ones of a plurality of global bitlines (GBLs), which may be metal bitlines (MBLs), but only two of these GBLs, labeled GBL-0 and GBL-1 are shown, for illustrative clarity. In this example, drain driver 532 is shown providing the read voltage (Vdr) on GBL-0.

Generally, in the reading operations described herein, the driving circuitry for providing drain read voltage (Vdr) has substantially the same characteristics in both the array and reference paths, to maintain matching. Moreover, the same drain driver circuit may be used to drive both array and reference drain ports. (In other words, there may be one common bitline driver for both 512 and 532, supplying an identical Vdr to the array cells and the reference cells.)

Sense amplifier (SA) 516 is essentially a comparator, and may output a signal when the output (cmi) of array cell "q" is greater than the output (tref) of reference cell "w". For single level cells, generally only one compare is needed. For multi-level array cells, a few compares may be needed, comparing the output of the cell "q" to various ones of different values stored in the reference cells.

The path for the array cell "q" is fully matched (substantially identical) to the path of the reference cell "w". For example:

- All switches (select, Ypath) are the same and controlled by the same voltages.
- The dominant capacitance along the path, which is the array global bitlines (GBLs) is matched by using array GBLs as loading for the reference cell.
- Local bitline (LBL, or diffusion bitline (DBL)) capacitance, which is less significant than GBL capacitance, is also matched between the array cell and the reference cell.
- When the number of wordlines (WLs) for memory array 510 is larger compared to the number of wordlines (WLs) of reference array 520, and thus the DBLs' lengths are smaller, several reference DBLs may be connected together to provide the correct matching.

Although FIG. 5 shows separate bitline drivers 512 and 532, the voltages provided by these two drivers is intended to be substantially identical, to maintain matching. More generally, it is desired to keep a main path capacitance matched between the array cells and the reference cell in terms of voltage level and all other parameters.

FIG. 5 provides an example of global bitlines (GBLs) being connected to external circuitry (exemplified by drivers 512, 532 and Y-muxes 514, 534) for operating the array and reference cells, while the local bitlines (LBLs) and diffusion bitlines (DBLs not explicitly shown) are connected (or directly associated) with the array and reference cells.

With the conventional read operation illustrated in FIG. 5, driving the array and reference cells with different voltages would result in a large mismatch between the reference path and array path because the most significant load of the path, the global bitlines (GBLs) would have different voltages.

Using A Lower Drain Voltage For Reading The Reference Cells

As mentioned hereinabove, drain disturb can be reduced by lowering the drain voltage (Vd) or drain-to-source voltage (Vds). (With 0 v source voltage, drain voltage Vd=Vds.) However, lowering Vds on the array cells can be problematic, particularly in the context of multilevel programming, where several (more than one) program level thresholds are involved, and thresholds are small. And, as mentioned above, it is important for matching to maintain the same voltage levels on the global bitlines (GBLs) for both the array cells and the reference cells, as well as other parameters relating to reading the array cells and the reference cells. A technique for lowering (reducing) the voltage (Vd, or Vds) for reading reference cells without compromising operation of the array cells or matching of the array cell and reference cell paths, will now be described.

Generally, the solution to the problem is by driving the same voltages to the global bitlines (GBLs) for both the array cells and the reference cells, so that the main matching path will be kept the same, while at the reference cell drain port, a different (lower) voltage is applied. The reference drain "port", for purposes of this discussion, is simply the diffusion bitline (DBL) associated with the drain of the cell being read. Thus, for the reference cells, the DBLs will have a different (lower) voltage than the GBLs. For the reference cells, a local bitline (LBL) strapped to the diffusion bitline (DBL) will also have a different (lower) voltage than the GBL, and for purposes of distinguishing between the higher voltage on the GBL and the DBL or LBL, the DBL and LBL may be considered to be equivalent. This can be done using various methods, using different trim options to the drain driver of the reference cell to lower the drain voltage at the drain port(s) of the reference cell(s). Some examples of such methods are described hereinbelow, without limiting the generality of the invention itself.

Generally, for the reference cells, the drain port voltage on the local bitline (LBL) and diffusion bitline (DBL) is different (lower) than the global bitline (GBL) voltage. And, for the array cells, the drain port voltage on the local bitline (LBL) and diffusion bitline (DBL) is substantially the same as the global bitline (GBL) voltage. And, the global bitline (GBL) voltages for both the array cells and the reference cells are maintained substantially the same, for matching. In fact, the GBL potential is usually somewhat larger than the LBL/DBL potential because of the voltage drop on the select transistor (IR drop) connecting the lines together, and this would be substantially the same for the array cells and the reference cells. Generally, the new circuitry disclosed herein will further reduce the reference drain voltage so that the voltage of drain LBL/DBL of the array cell could be higher than the voltage of the drain LBL/DBL of the reference cell and, conversely, the drain voltage on the reference cells can be lower than the drain voltage on the array cells. The general idea is to operate the reference cells with a lower, different drain voltage, without compromising operation of the array cells.

Advantages:
Optimization of drain voltage of array cells and reference cells is decoupled from each other.
Same circuitry for the drain driver, keeping the matching of this (sometime complicated) circuit intact.
Matching of sensing path is only slightly affected.

Embodiment 1

Clamping the Drain Voltage

Figure 6:
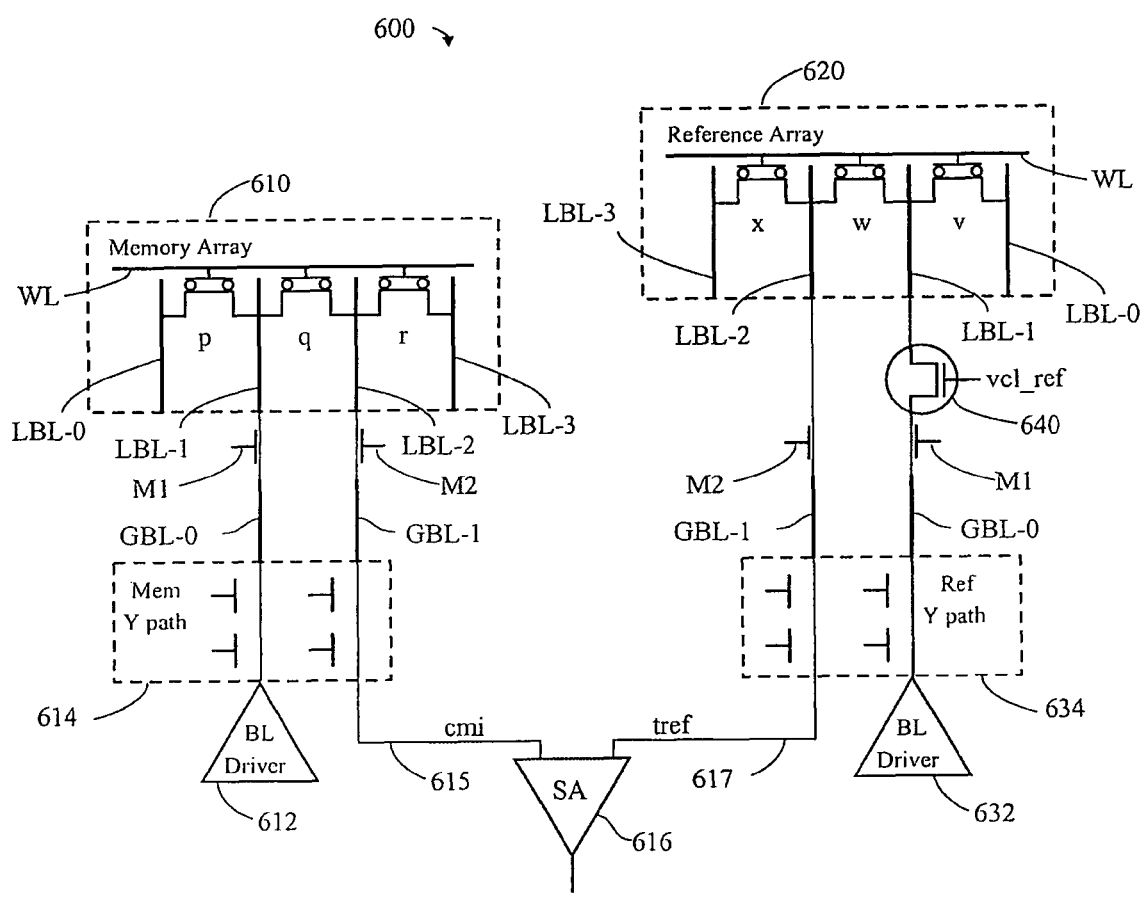
FIG. 6 is a diagram illustrating an embodiment of the technique for using lower drain voltage for reading reference cells, according to the disclosure.

FIG. 6 is a diagram illustrating an embodiment of the technique for using lower drain voltage for reading reference cells, according to the disclosure. Elements which are similar to those set forth in FIG. 5 are similarly labeled.

An overall array 600 (compare 500) of NVM memory cells, such as flash cells is divided into two parts (portions, sectors), a memory sector 610 (compare 510) and a reference sector 620 (compare 520). Each of these sectors is an "array" in its own right, and may be referred to as such (that is, "memory array" 610 and "reference array" 620). However, reference array 620 may contain substantially fewer memory cells than memory array 610. (As mentioned above, there may be, for example, approximately 8 million times more array cells than reference cells.)

Memory array 610 comprises a plurality of wordlines (WL) and a plurality of array cells "p", "q" and "r". Memory array 610 comprises a plurality of bitlines, which are local bitlines (LBLs), labeled LBL-0, LBL-1, LBL-2 and LBL-3 are shown, for illustrative clarity. The illustrative memory cell "q" which will be read, may be an NROM cell. For purposes of this discussion, the local bitlines (LBLs) may be considered to be the equivalent of the diffusion bitlines (DBLs).

A bitline driver 612 (or "drain driver") provides the read voltage (Vdr) via a multiplexer (Y-mux, set of decoded switches) 614 to selected ones of a plurality of global bitlines (GBLs), which may be metal bitlines (MBLs), but only two of these GBLs, labeled GBL-0 and GBL-1 are shown, for illustrative clarity. A select transistor M1 is shown connecting LBL-1 to GBL-0, and a select transistor M2 is shown connecting LBL-2 to GBL-1. In this example, driver 612 is shown providing the read voltage (Vdr) on GBL-0, hence (via M1), onto LBL-1, hence onto the diffusion bitline (DBL) associated with the drain of array cell "q".

A bitline driver 632 (or "drain driver") provides the read voltage (Vdr) via a multiplexer (Y-mux, set of decoded switches) 634 to selected ones of a plurality of global bitlines (GBLs), which may be metal bitlines (MBLs), but only two of these GBLs, labeled GBL-0 and GBL-1 are shown, for illustrative clarity. In this example, driver 632 is shown providing the read voltage (Vdr) on GBL-0.

In this example of reading the right bit of array cell "q", local bitline LBL-1 is used as drain (D), and local bitline LBL-2 is used as source (S). The local bitlines (LBL) may be strapped to diffusion bitlines (DBLs). Source-side sensing or drain-side sensing can be used to read the right bit.

Current flowing from the source (S), via LBL-2, M2, GBL-1 and Y-mux 614 (compare 514) is provided on a line 615 (compare 515) generating a voltage (cmi) to one input of a differential sense amplifier (SA) 616 (compare 516), and will be compared in the sense amplifier (SA) 616 against a corresponding current coming from the source of a reference cell generating a voltage (tref).

Reference array 620 is arranged substantially identically to memory array 610, and is illustrated in FIG. 6 as a "mirror image" thereof. Three reference cells "v", "w" and "x" are shown. Local bitlines LBL-0 and LBL-1 are selectively connected via select transistors (M1 and M2 to global bitlines GBL-0 and GBL-1. As illustrated, a current indicative of a program level in the left bit of cell "w" is being read, generating a voltage (tref) using source-side sensing, and provided on a line 617 (compare 517) to the other input of sense amplifier (SA) 616.

In this example of reading array cell "w", LBL-2 is used as source (S), and local bitline LBL-1 is used as drain (D). The local bitlines (LBL) may be diffusion bitlines (DBLs).

In the previous example (FIG. 5) of a conventional read operation, the local bitlines LBL-1 and LBL-2 in (associated with) reference array 520 are connected via select transistors M1 and M2 in reference array 520 to the global bitlines GBL-1 and GBL-2 associated with reference array 520, respectively. Since the select transistors M1 and M2 are functioning essentially as simple "switches", the voltages (Vdr, ground) on the global bitlines (GBLs) is substantially equal to the voltages (Vdr, ground) on the local bitlines (LBLs).

In this example (FIG. 6) of using a lower drain voltage for reading the reference cells, a FET transistor 640 may be connected between GBL-0 and LBL-1 of reference array 620. (For purposes of this example, the LBL for cell "w" may be considered to be the equivalent of the DBL for the cell "w".) Transistor 640 may be an NMOS transistor (or NFET), connected such that its drain (D) is connected to the select transistor M1, its source (S) is connected to the drain side local bitline LBL-1 of the reference cell "w", and its gate (G) is connected to a regulated voltage "vcl_ref". In this manner, the drain voltage of the reference cell may be clamped (limited, reduced) to a value, chosen according to read disturb criteria for the reference cells, which is lower than the drain voltage of the array cells, thereby reducing read disturb on the reference cells. The drain read voltage on the array cells is not disturbed, and the drain read voltage on GBL-0 of the reference array is maintained substantially equal to the drain read voltage on GBL-0 of the memory array to effectuate matching.

As before (FIG. 5), sense amplifier (SA) 616 may output a signal when the output of array cell "q" is greater than the output of reference cell "w". For single level cells, generally only one compare is needed. For multilevel array cells, a few compares may be needed, comparing the output of the cell "q" to various ones of the reference cells.

FIG. 6 provides an example of global bitlines (GBLs) being connected to external circuitry (exemplified by drivers 612, 632 and Y-muxes 614, 634) for operating the array and reference cells, while the local bitlines (LBLs) and diffusion bitlines (DBLs not explicitly shown) are connected (or directly associated) with the array and reference cells.

The path for the array cell "q" is fully matched (substantially identical) to the path of the reference cell "w". For example:

All switches (select, Ypath) are the same and controlled by the same voltages.
The dominant capacitance along the path, which is the array global bitlines (GBLs) is matched by using array GBLs as loading for the reference cell.
Local bitline (LBL, or diffusion bitline (DBL)) capacitance, which is less significant than GBL capacitance, may also be matched between the array cell and the reference cell.

When the number of wordlines (WLs) for the memory array 610 is larger compared to the number of wordlines (WLs) of the reference array 620, and thus the DBLs' lengths are smaller, several reference DBLs may be connected together to provide the correct matching.

Embodiment 2

Reducing the Drain Voltage

Figure 7:
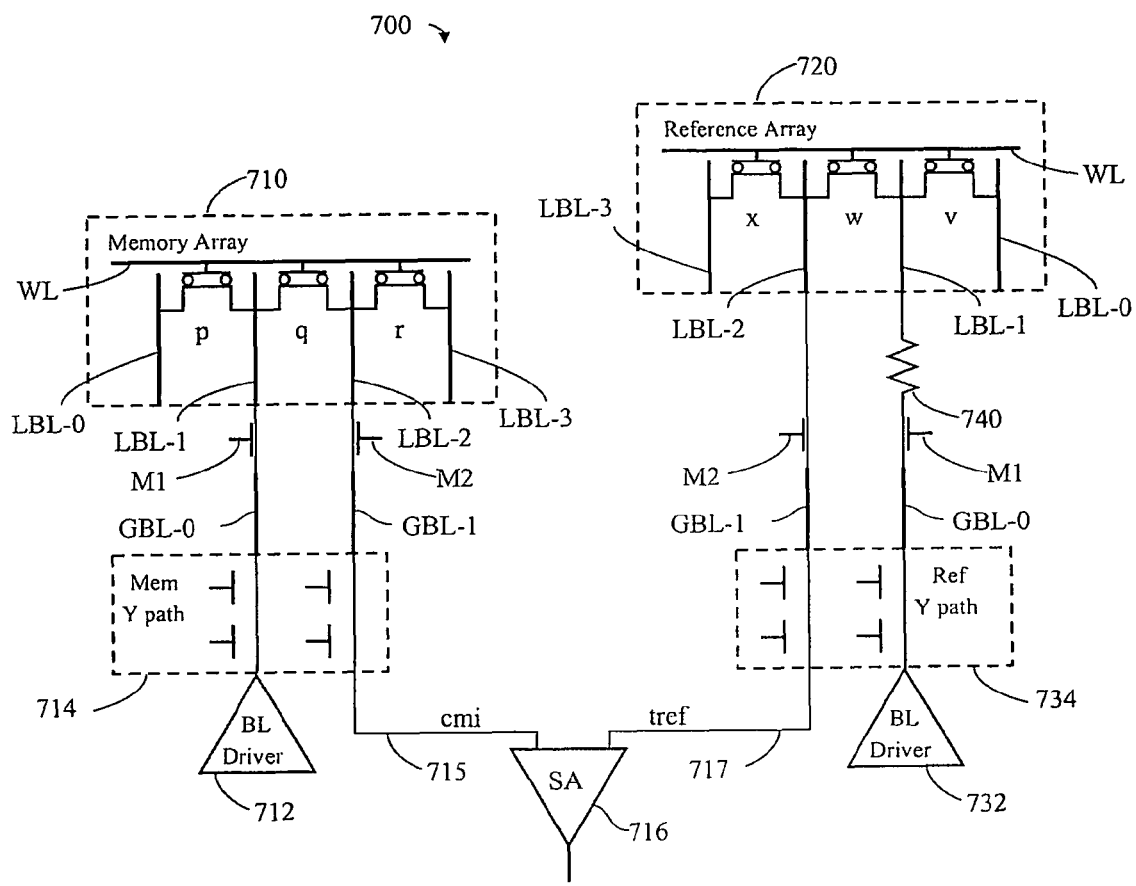
FIG. 7 is a diagram illustrating an embodiment of the technique for using lower drain voltage for reading reference cells, according to the disclosure.

FIG. 7 is a diagram illustrating an embodiment of the technique for using lower drain voltage for reading reference cells, according to the disclosure. Elements which are similar to those set forth in FIG. 5 are similarly labeled. Most of the elements are also similar to those presented in FIG. 6. And, the overall concept of lowering the drain port voltage when reading the reference cells is similar to what was discussed with respect to FIG. 6.

An overall array 700 (compare 500) of NVM memory cells, such as flash cells is divided into two parts (portions, sectors), a memory sector 710 (compare 510) and a reference sector 720 (compare 520). Each of these sectors is an "array" in its own right, and may be referred to as such (that is, "memory array" and "reference array"). However, reference array 720 may contain substantially fewer memory cells than memory array 710.

Memory array 710 comprises a plurality of wordlines (WL) and a plurality of array cells "p", "q" and "r". Memory array 710 comprises a plurality of bitlines, which are local bitlines (LBLs), such as diffusion bitlines (DBLs), labeled LBL-0, LBL-1, LBL-2 and LBL-3 are shown, for illustrative clarity. The illustrative memory cell "q" may be an NROM cell.

A bitline driver 712 (or "drain driver") provides the read voltage (Vdr) via a multiplexer (Y-mux, set of decoded switches) 714 to selected ones of a plurality of global bitlines (GBLs), which may be metal bitlines (MBLs), but only two of these GBLs, labeled GBL-0 and GBL-1 are shown, for illustrative clarity. A select transistor M1 is shown for connecting LBL-1 to GBL-0, and a select transistor M2 is shown for connecting LBL-2 to GBL-1. In this example, driver 712 is shown providing the read voltage (Vdr) on GBL-0, hence (via M1), onto LBL-1, hence onto the diffusion bitline (DBL) associated with the drain of array cell "q".

A bitline driver 732 (or "drain driver") provides the read voltage (Vdr) via a multiplexer (Y-mux, set of decoded switches) 734 to selected ones of a plurality of global bitlines (GBLs), which may be metal bitlines (MBLs), but only two of these GBLs, labeled GBL-0 and GBL-1 are shown, for illustrative clarity. In this example, driver 712 is shown providing the read voltage (Vdr) on GBL-0.

In this example of reading the right bit of array cell "q", local bitline LBL-1 is used as drain (D), and local bitline LBL-2 is used as source (S). The local bitlines (LBL) may be diffusion bitlines (DBLs). Source-side sensing or drain-side sensing can be used to read the right bit. Current flowing from the source (S), via LBL-2, M2, GBL-1 and Y-mux 714 (compare 514) is provided on a line 715 (compare 515) generating a voltage (cmi) to one input of a differential sense amplifier (SA) 716 (compare 516), and will be compared in the sense amplifier (SA) 716 against a corresponding current coming from the source of a reference cell generating a voltage (tref).

Reference array 720 is arranged substantially identically to memory array 710, and is illustrated in FIG. 7 as a "mirror image" thereof. Three reference cells "v", "w" and "x" are shown. Local bitlines LBL-0 and LBL-1 are selectively connected via select transistors (M1 and M2) to global bitlines GBL-0 and GBL-1. As illustrated, a current indicative of a program level in the left bit of cell "w" is being read, generating a voltage (tref) using source-side sensing, and provided on a line 717 (compare 517) to the other input of the sense amplifier (SA) 716.

In this example of reading array cell "w", LBL-2 is used as source (S), and local bitline LBL-1 is used as drain (D). The local bitlines (LBL) may be diffusion bitlines (DBLs).

In the previous example (FIG. 6), of using a lower drain voltage for reading the reference cells, a FET transistor (640) is shown connected between GBL-0 and LBL-1 of reference array (620), as a means of reducing the drain voltage applied to the reference cells.

In this embodiment (FIG. 7), a resistor 740 is shown connected between GBL-0 and LBL-1 of reference array 720, as a means of reducing the drain voltage applied to the reference cells. This reduces the drain voltage of the reference cell(s) by a pre-defined value, according to read disturb criteria for the reference cells, which is lower than the drain voltage of the array cells, thereby reducing read disturb on the reference cells. As in the previous embodiment (FIG. 6), the drain read voltage on the array cells is not disturbed, and the drain read voltage on GBL-0 of the reference array is maintained substantially equal to the drain read voltage on GBL-0 of the memory array to effectuate matching.

Resistor 740 is presented as but one of a number of known devices that can cause a voltage drop (sometimes referred to as an "IR" drop"), in this case from the GBL to the LBL. Other voltage drop devices may include a transistor in a resistive mode of operation, and the like.

As before (FIG. 5, FIG. 6), sense amplifier (SA) 716 may output a signal when the output of array cell "q" is greater than the output of reference cell "w". For single level cells, generally only one compare is needed. For multilevel array cells, a few compares may be needed, comparing the output of the cell "q" to various ones of the reference cells.

FIG. 7 provides an example of global bitlines (GBLs) being connected to external circuitry (exemplified by drivers 712, 732 and Y-muxes 714, 734) for operating the array and reference cells, while the local bitlines (LBLs) and diffusion bitlines (DBLs not explicitly shown) are connected (or directly associated) with the array and reference cells.

The path for the array cell "q" is fully matched (substantially identical) to the path of the reference cell "w". For example:
- All switches (select, Ypath) are the same and controlled by the same voltages.
- The dominant capacitance along the path, which is the array global bitlines (GBLs) is matched by using array GBLs as loading for the reference cell.
- Local bitline (LBL, or diffusion bitline (DBL)) capacitance, which is less significant than GBL capacitance, may also be matched between the array cell and the reference cell.
- When the number of wordlines (WLs) for the memory array 710 is larger compared to the number of wordlines (WLs) of the reference array 730, and thus the DBLs' lengths are smaller, several reference DBLs may be connected together to provide the correct matching.

There have thus been described two embodiments (FIGS. 6 and 7) of techniques for applying a drain voltage (Vd-ref) to the reference cells which is different than, such as lower than, the drain voltage (Vd-array) which is applied to the array cells. This is accomplished by applying the same drain voltage to the global bitlines (GBLs) serving both the array cells and the reference cells, but on the reference path, adding circuitry, such as a FET (FIG. 6) or a resistor (FIG. 7) reduces the drain voltage on the reference flash cell port itself. In this manner, the matching of the circuitry providing the drain voltage (in terms of noise, coupling, power supply rejection ratio, and more) may be maintained, and this also maintains the matching of the significant path capacitance, which is the global bit lines (GBLs). Generally, the only mismatch introduced by this technique is at the flash cell port (drain side), where the capacitance is relatively low, and thus the resulting mismatch is small.

Advantages of the techniques disclosed herein may include:
- Optimization of drain voltage of array cells and reference cells is decoupled from each other.
- Same circuitry for the drain driver, keeping the matching of this (sometime complicated) circuit intact.
- Matching of sensing path is only slightly affected.

The method disclosed herein may significantly reduce the read disturb on a reference flash cell without affecting the operating point of the array flash cells, by applying different (lower) drain voltage to the reference cell compared to the array cells. This may be done while using the same drain driving circuitry. This may also be done while keeping the main path capacitance matched between the array cells and the reference cell in terms of voltage level and all other parameters.

Different drain voltage may be implemented by applying additional circuitry for reducing the drain voltage of the reference cell at its drain port. This additional circuitry may be a clamping device.

Different drain voltage may also be implemented by using different trim options to the drain driver of the reference cell to lower the drain voltage. Voltage drop may also be used to reduce the reference drain voltage.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What we claim is:

1. A method of sensing nonvolatile memory ("NVM") cells comprising: applying a first drain or source (drain/source) voltage to an NVM data bearing cell and applying a second drain or source (drain/source) voltage, which is substantially always lower than the first drain/source voltage, to an NVM reference cell used to sense the NVM data bearing cell.

2. The method of claim 1, wherein drain/source voltages on global bitlines (GBLs) for both the data bearing and the reference cell are substantially the same; and drain/source voltages on local bitlines (LBLs) for the data bearing and the reference cells are different than one another.

3. The method of claim 2, wherein the drain/source voltage on local bitlines (LBLs) for the reference cell is lower than the drain/source voltage on local bitlines (LBLs) for the data bearing cell.

4. The method of claim 1, further comprising using first drain or source driving circuitry to provide the first drain/source voltage; and using second drain or source (drain/source) driving circuitry to provide the second drain/source voltage.

5. The method of claim 1, wherein a sensing path capacitance for the data bearing cell and a sensing path capacitance for the reference cell is substantially matched.

6. The method of claim 1, further comprising reducing the drain/source voltage of the reference cell at a drain or source port.

7. The method of claim 6, wherein reducing the drain/source voltage includes using a clamping device.

8. The method of claim 6, wherein reducing the drain/source voltage includes using a resistor or a transistor connected as a resistor.

9. The method of claim 1, wherein applying a different drain/source voltage to the reference is achieved by using a different trim option with the drain or source driver of the reference cell.

10. The method of claim 1, further comprising source-side sensing to read both the data bearing cell and the reference cell.

11. The method of claim 1, further comprising using drain-side sensing to read both the data bearing cell and the reference cell.

12. A memory device comprising non-volatile memory (NVM) cells comprising: one or more data bearing cells; one or more reference cells adapted to be used for sensing or reading data bearing cells; and one or more circuit portions adapted to substantially always apply a lower drain or source (drain/source) voltage to a reference cell being used to sense a data bearing cell than the drain or source (drain/source) voltage being applied to the cell being sensed.

13. The device according to claim 12, wherein said one or more circuit portions are adapted to reduce a voltage between a voltage supply and a drain/source of the reference cell.

14. The device according to claim 13, wherein said one or more circuit portions are adapted to reduce a voltage between a global bitline and a local bitline associated with the drain/source of the reference cell.

15. The device according to claim 14, wherein said one or more circuit portions are comprised of a clamping device.

16. The device according to claim 15, wherein said one or more circuit portions are comprised of a resistor or a transistor connected as a resistor.

17. The device according to claim 15, wherein said one or more circuit portions are comprised of a field effect transistor ("FET") transistor having its drain (D) connected to a given second global bitline, its source (S) connected to a given local bitline, and its gate (G) connected to a regulated voltage.

* * * * *